United States Patent
Huang et al.

(10) Patent No.: US 12,326,977 B2
(45) Date of Patent: Jun. 10, 2025

(54) DISPLAY DEVICE

(71) Applicant: Innolux Corporation, Miaoli County (TW)

(72) Inventors: Yu-Chia Huang, Miaoli County (TW); Yuan-Lin Wu, Miaoli County (TW); Hsiao-Lang Lin, Miaoli County (TW); Tsung-Han Tsai, Miaoli County (TW); Kuan-Feng Lee, Miaoli County (TW)

(73) Assignee: Innolux Corporation, Miaoli (TW)

( * ) Notice: Subject to any disclaimer, the term of this patent is extended or adjusted under 35 U.S.C. 154(b) by 0 days.

(21) Appl. No.: 18/433,439

(22) Filed: Feb. 6, 2024

(65) Prior Publication Data
US 2024/0211048 A1    Jun. 27, 2024

Related U.S. Application Data

(63) Continuation of application No. 17/963,207, filed on Oct. 11, 2022, now Pat. No. 11,928,261.

(30) Foreign Application Priority Data

Nov. 10, 2021   (CN) .......................... 202111327237.7

(51) Int. Cl.
| | |
|---|---|
| *G06F 3/01* | (2006.01) |
| *G06F 3/041* | (2006.01) |
| *H10K 59/00* | (2023.01) |
| *H10K 59/40* | (2023.01) |
| *H10K 77/10* | (2023.01) |
| *H10K 102/00* | (2023.01) |

(52) U.S. Cl.
CPC ............ *G06F 3/016* (2013.01); *G06F 3/0412* (2013.01); *H10K 59/00* (2023.02); *H10K 59/40* (2023.02); *H10K 77/111* (2023.02); *G06F 2203/04102* (2013.01); *G06F 2203/04103* (2013.01); *H10K 2102/311* (2023.02)

(58) Field of Classification Search
CPC .................. G06F 3/016; G06F 3/0412; G06F 2203/04102; G06F 2203/04103; H10K 59/00; H10K 59/40; H10K 77/111; H10K 2102/211

See application file for complete search history.

(56) References Cited

U.S. PATENT DOCUMENTS

| | | | | |
|---|---|---|---|---|
| 11,513,566 | B2 * | 11/2022 | Kim | ........................ G06F 1/1656 |
| 2010/0328053 | A1 * | 12/2010 | Yeh | .......................... G06F 3/016 |
| | | | | 345/173 |
| 2020/0293093 | A1 * | 9/2020 | Kim | ........................ G06F 1/1652 |
| 2022/0201105 | A1 * | 6/2022 | Lee | ............................. G06F 1/16 |

FOREIGN PATENT DOCUMENTS

CN          112346592         2/2021

OTHER PUBLICATIONS

"Office Action of China Counterpart Application", issued on Mar. 17, 2025, p. 1-p. 8.

* cited by examiner

*Primary Examiner* — Peter D McLoone
(74) *Attorney, Agent, or Firm* — JCIPRNET

(57) ABSTRACT

The disclosure provides a display device. The display device includes a display panel, a substrate and a plurality of vibrators. The substrate overlapped with the display panel. The plurality of vibrators overlapped with the display panel, wherein at least a part of the plurality of vibrators are arranged along a part of an edge of the substrate.

7 Claims, 18 Drawing Sheets

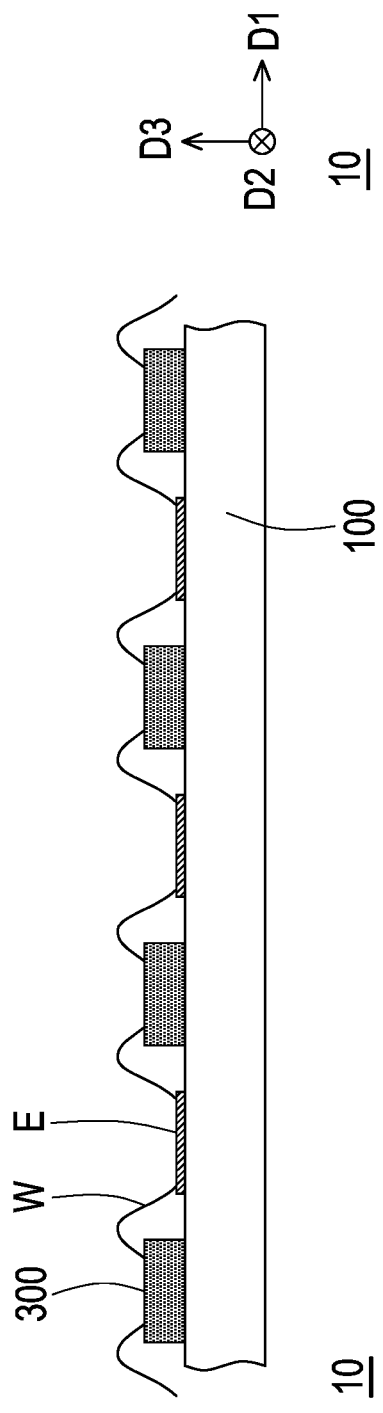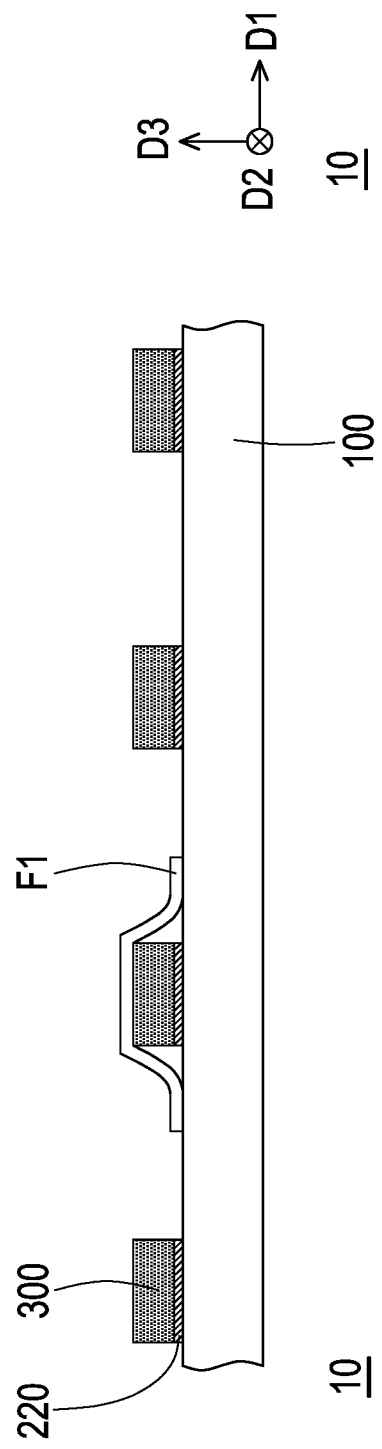

DISPLAY DEVICE

CROSS-REFERENCE TO RELATED APPLICATION

This application is a continuation application of and claims the priority benefit of a prior application Ser. No. 17/963,207, filed on Oct. 11, 2022, which claims the priority benefit of China application serial no. 202111327237.7, filed on Nov. 10, 2021. The entirety of each of the above-mentioned patent applications is hereby incorporated by reference herein and made a part of this specification.

BACKGROUND

Technical Field

The disclosure relates to a display device.

Description of Related Art

With the technological advancement of modern electronic products, electronic devices on the market have introduced various functions for interacting with users, allowing users to experience feedback when using these electronic devices. For example, when users use electronic devices, they may experience tactile feedback such as vibrations. As a result, the development of interactive electronic devices is one of the techniques that have been vigorously developed in recent years.

SUMMARY

The disclosure provides an electronic device including a vibrator, wherein the yield of the electronic device is improved; or the efficiency of manufacturing the electronic device may be improved or the manufacturing process cost of the electronic device may be reduced.

According to an embodiment of the disclosure, the display device includes a display panel, a substrate and a plurality of vibrators. The substrate overlapped with the display panel. The plurality of vibrators overlapped with the display panel, wherein at least a part of the plurality of vibrators are arranged along a part of an edge of the substrate.

In order to make the above features and advantages of the disclosure better understood, embodiments are specifically provided below with reference to figures for detailed description as follows.

BRIEF DESCRIPTION OF THE DRAWINGS

The accompanying drawings are included to further understand the disclosure, and the drawings are incorporated in the specification and constitute a part of the specification. The drawings illustrate embodiments of the disclosure and, together with the description, serve to explain principles of the disclosure.

FIG. 5D is a schematic partial cross-sectional view according to FIG. 5C.

FIG. 5E is a schematic cross-sectional view of a first function layer disposed on a plurality of vibrators in a display device of an embodiment of the disclosure.

DESCRIPTION OF THE EMBODIMENTS

Figure 1:
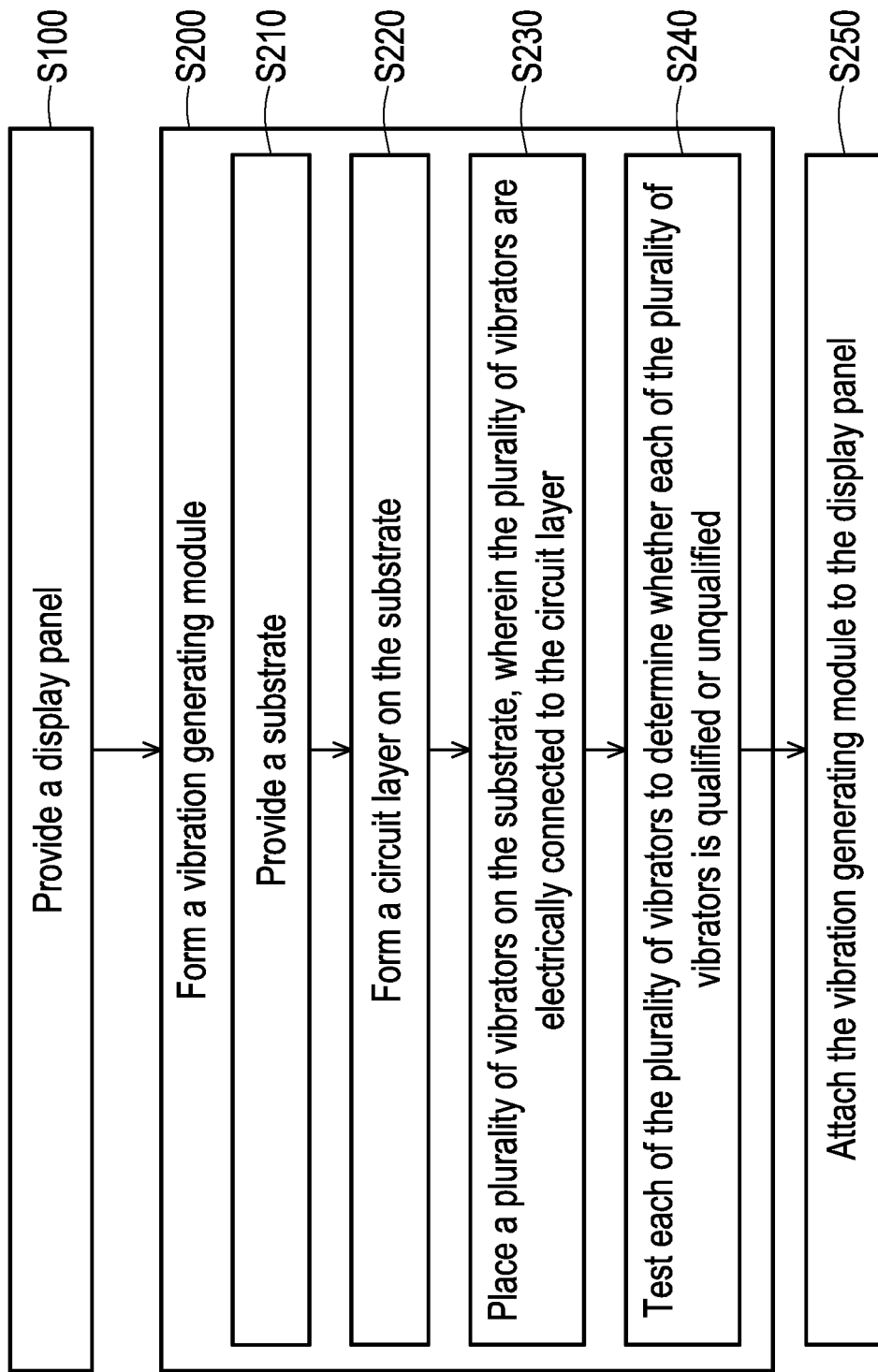
FIG. 1 is a flowchart of a partial manufacturing process of a display device of an embodiment of the disclosure.

The disclosure may be understood by referring to the following detailed description in conjunction with the accompanying drawings. It should be noted that in order to facilitate understanding to the reader and to simplify the drawings, the multiple drawings in the disclosure depict a part of the electronic device, and certain elements in the drawings are not drawn to actual scale. In addition, the number and size of each element in the figures are for illustration, and are not intended to limit the scope of the disclosure.

Certain terms are used throughout the specification and the appended claims of the disclosure to refer to particular elements. Those skilled in the art should understand that electronic device manufacturers may refer to the same elements under different names. This article is not intended to distinguish between elements having the same function but different names. In the following description and claims, the words "including", "containing", "having" and the like are open terms, so they should be interpreted as meaning "including but not limited to . . . " Therefore, when the terms "including", "containing" and/or "having" are used in the description of the disclosure, they specify the presence of corresponding features, regions, steps, operations, and/or members, but do not exclude the presence of one or more corresponding features, regions, steps, operations, and/or members.

The terminology mentioned in the specification, such as: "up", "down", "front", "rear", "left", "right", etc., are directions referring to the drawings. Therefore, the directional terms used are used for illustration, not for limiting the disclosure. In the drawings, each drawing depicts general features of methods, structures, and/or materials used in specific embodiments. However, these drawings should not be construed to define or limit the scope or nature covered by these embodiments. For example, for clarity, the relative size, thickness, and location of each film, region, and/or structure may be reduced or enlarged.

When a corresponding member (such as a film or region) is referred to as "on another member", it may be directly on the other member, or there may be other members between the two. Moreover, when a member is referred to as "directly on another member", there is no member between the two. In addition, when a member is referred to as "on another member", the two members have an up-down relationship in the top view, and this member may be above or below the other member, and this up-down relationship depends on the orientation of the device.

The terms "about", "equal to", "equal" or "identical", "substantially" or "roughly" are generally interpreted as being within 20% of a given value, or interpreted as being within 10%, 5%, 3%, 2%, 1%, or 0.5% of a given value.

The ordinal numbers used in the specification and claims, such as "first", "second", etc., are used to modify an element. They do not themselves imply and represent that the element(s) have any previous ordinal number, and also do not represent the order of one element and another element, or the order of manufacturing methods. The use of these ordinal numbers is to clearly distinguish an element with a certain name from another element with the same name. The same terms may not be used in the claims and the specification, and accordingly, the first member in the specification may be the second member in the claims.

It should be noted that in the following embodiments, the features in several different embodiments may be replaced, recombined, and mixed to complete other embodiments without departing from the spirit of the disclosure. As long as the features between the embodiments do not violate the spirit of the disclosure or conflict with each other, they may be mixed and used arbitrarily.

The electrical connection or coupling described in the present disclosure may refer to direct connection or indirect connection. In the case of direct connection, the endpoints of the elements on two circuits are directly connected or connected to each other by a conductive line segment. In the case of indirect connection, there are switches, diodes, capacitors, inductors, other suitable elements, or a combination of the elements between the endpoints of the elements on the two circuits, but is not limited thereto.

In the present disclosure, the thickness, length, and width may be measured using an optical microscope, and the thickness may be measured from a cross-sectional image in an electron microscope, but is not limited thereto. In addition, there may be a certain error in any two values or directions for comparison. If the first value is equal to the second value, it implies that there may be an error of about 10% between the first value and the second value. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

An electronic device of the disclosure may include a display, an antenna (such as a liquid-crystal antenna), light-emitting, sensing, touch, tiling, other suitable functions, or a combination of the functions, but is not limited thereto. The electronic device includes, but is not limited to, a rollable or flexible electronic device. The electronic device may include, for example, a liquid crystal, a diode, a light-emitting diode (LED), a quantum dot (QD), fluorescence, phosphor, other suitable materials, or a combination of the above. The LED may include, for example, an organic LED (OLED), a micro LED, a mini LED, a quantum dot LED (QLED, QDLED), but is not limited thereto. The following uses a display device or a tiling device as an electronic device to explain the content of the disclosure, but the disclosure is not limited thereto.

The following exemplifies the exemplary embodiments of the disclosure. The same reference numerals are used in the drawings and descriptions to represent the same or similar parts.

Figure 2:
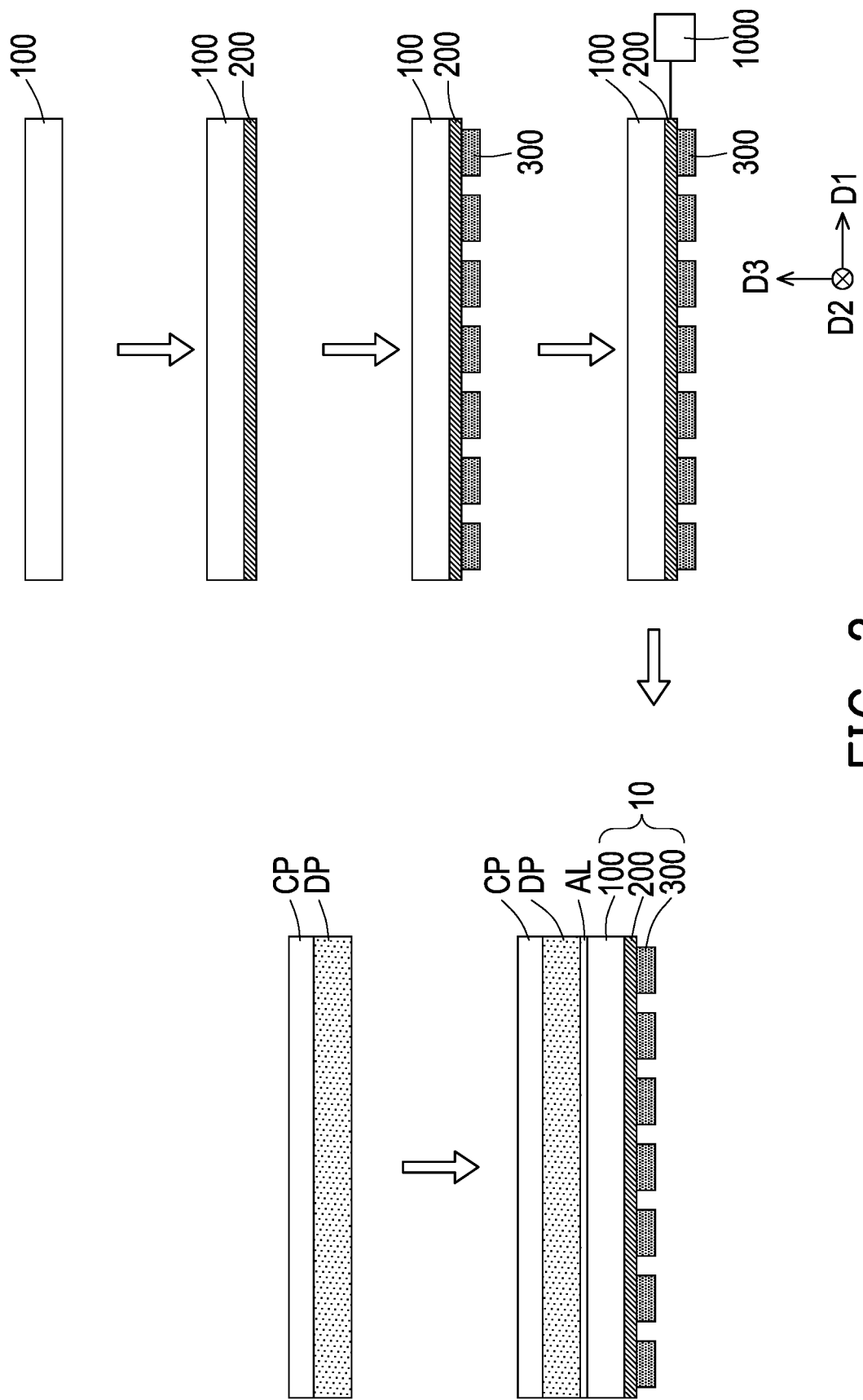
FIG. 2 is a schematic diagram of a manufacturing method of a display device of an embodiment of the disclosure.
Figure 3:
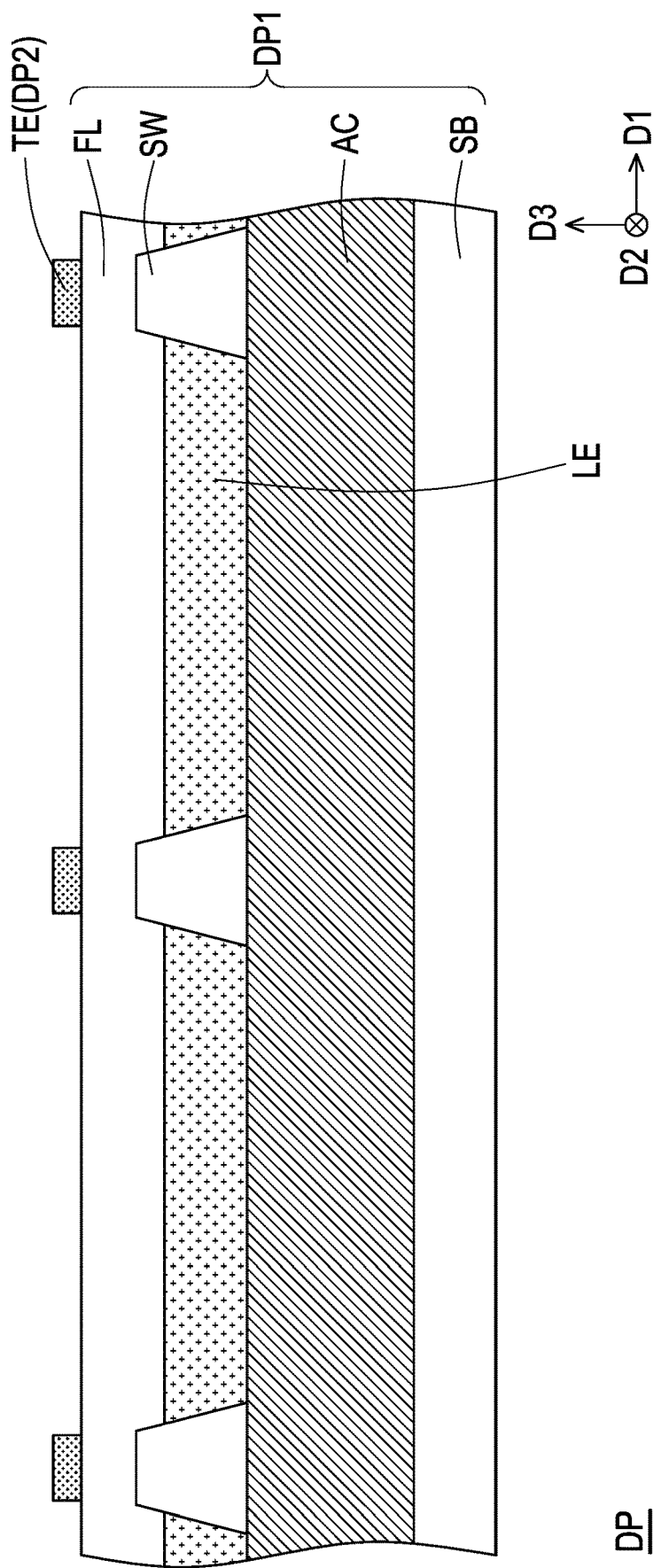
FIG. 3 is a schematic cross-sectional view of a display panel in a display device of an embodiment of the disclosure.
Figure 4A:
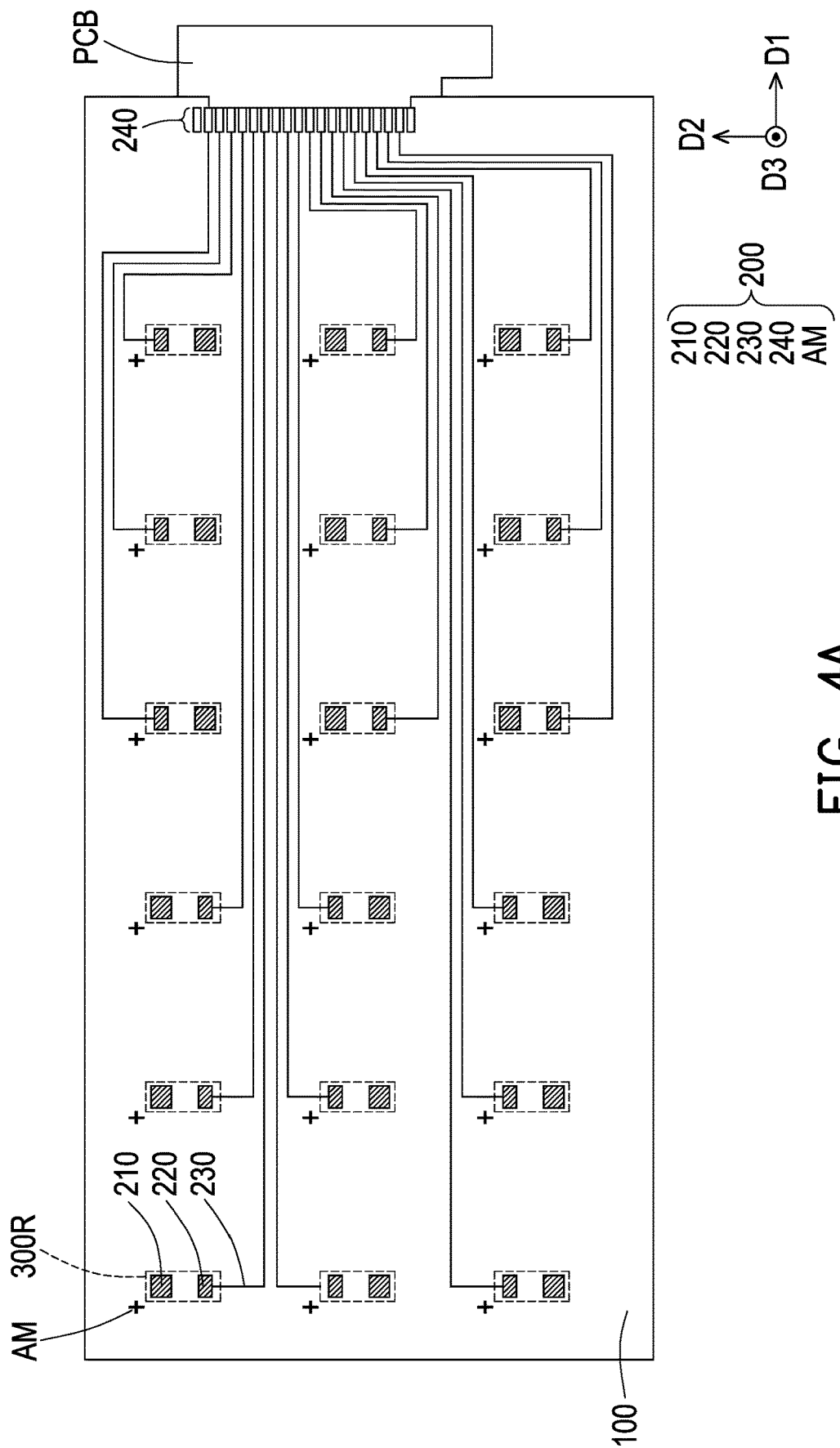
FIG. 4A is a schematic top view of a circuit layer in a display device of an embodiment of the disclosure.
Figure 4B:
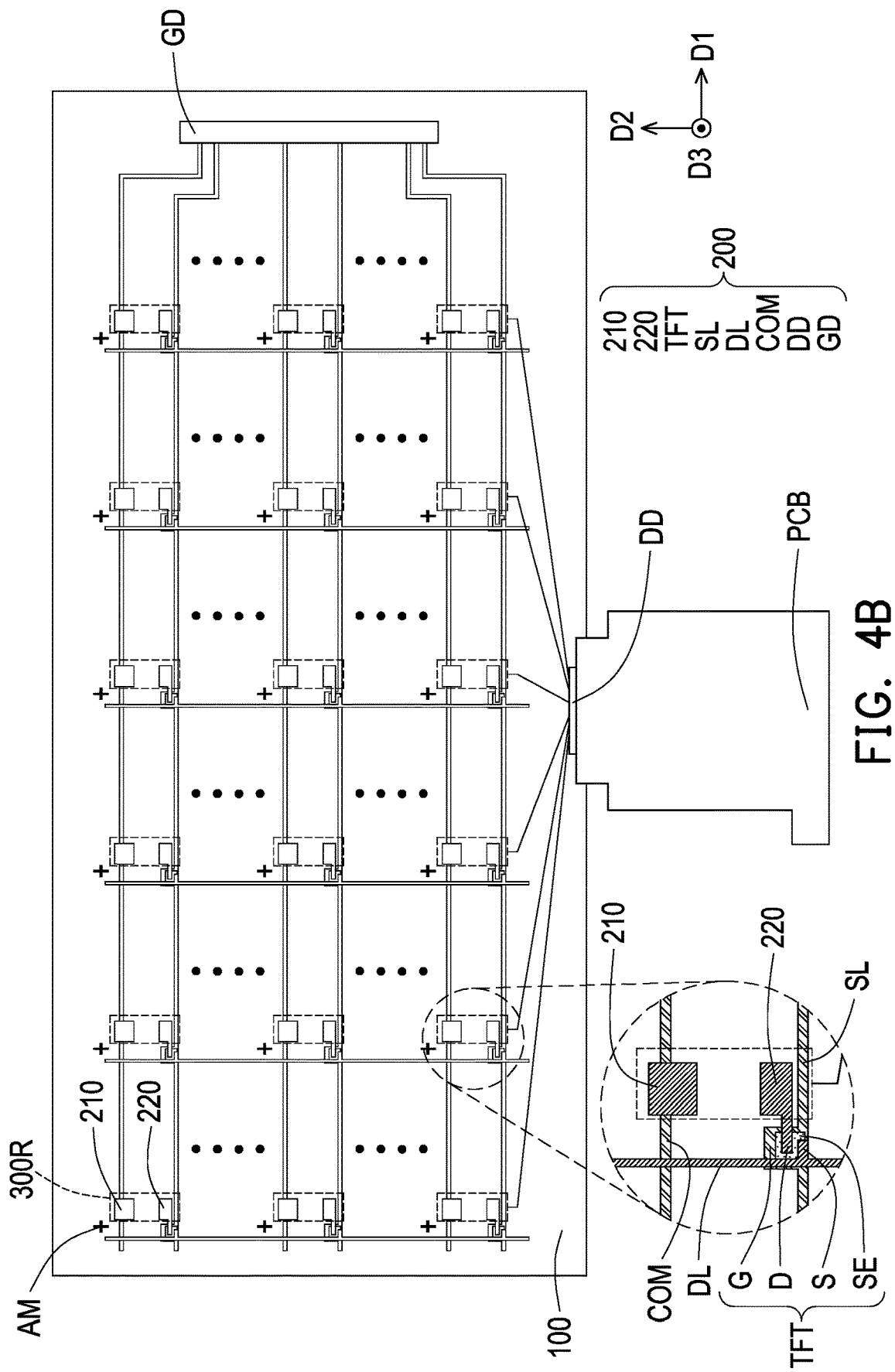
FIG. 4B is a schematic top view of a circuit layer in a display device of another embodiment of the disclosure.
Figure 5A:
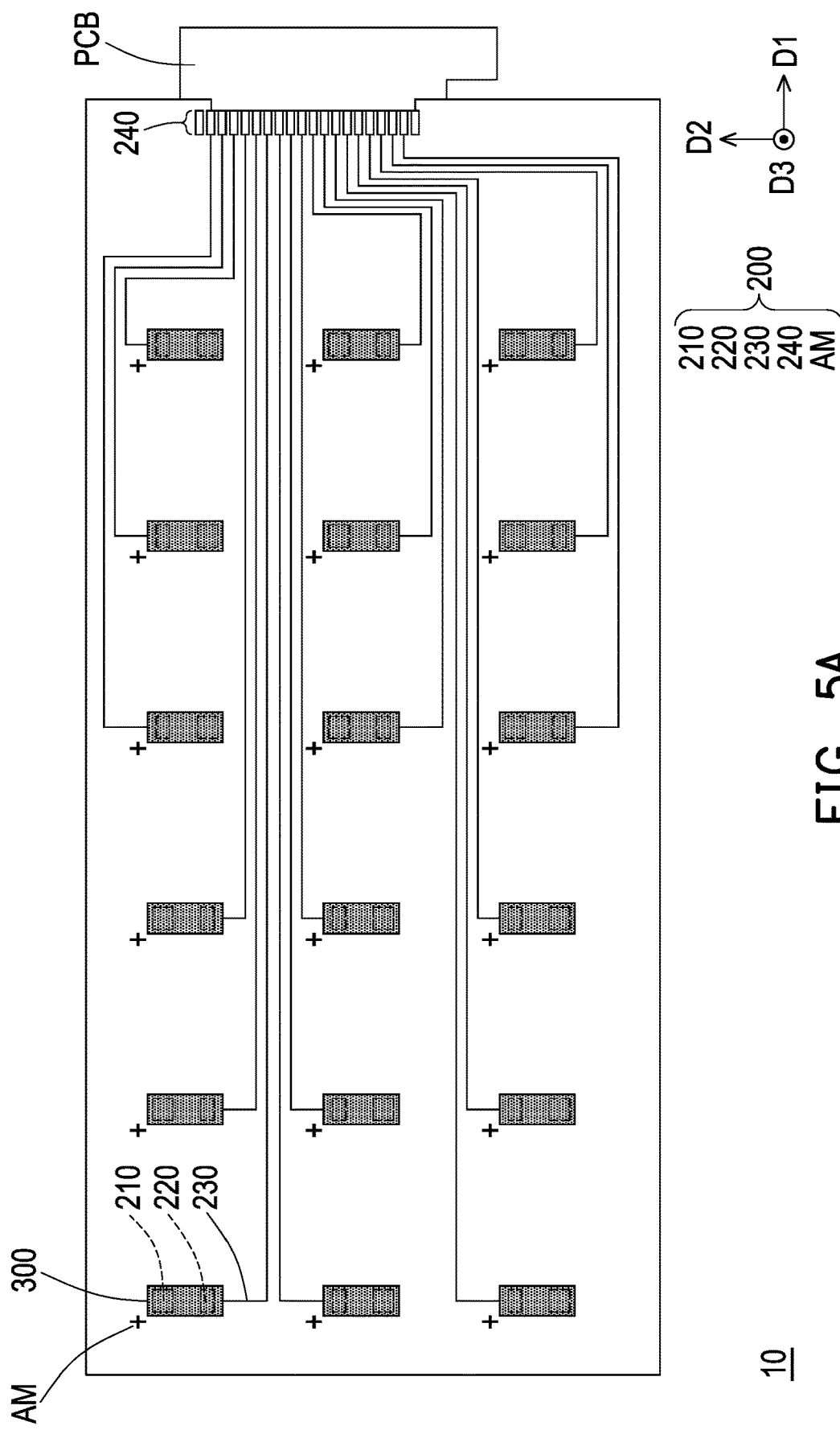
FIG. 5A is a schematic top view of a vibration generating module in a display device of an embodiment of the disclosure.
Figure 5B:
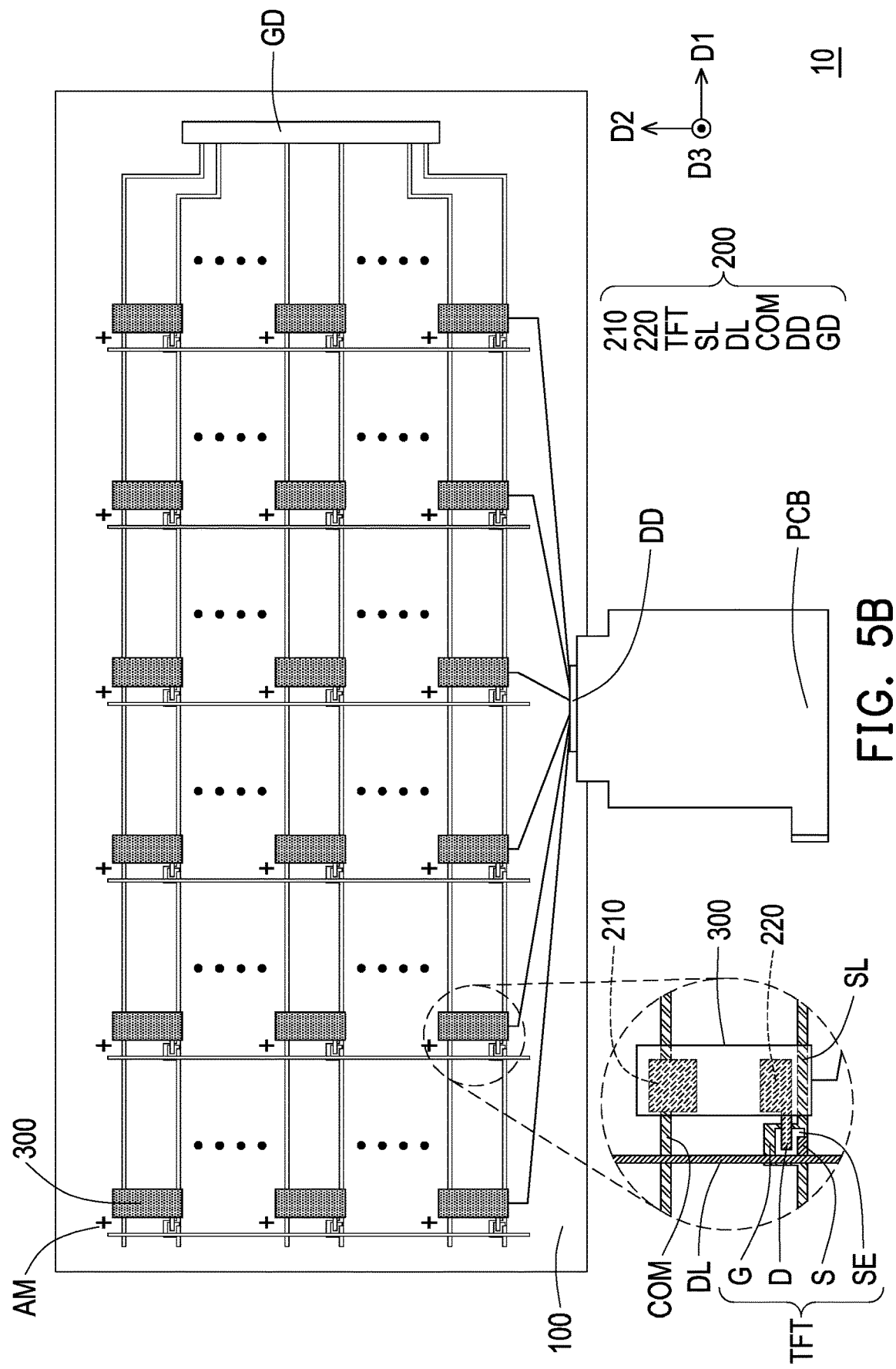
FIG. 5B is a schematic top view of a vibration generating module in a display device of another embodiment of the disclosure.
Figure 5C:
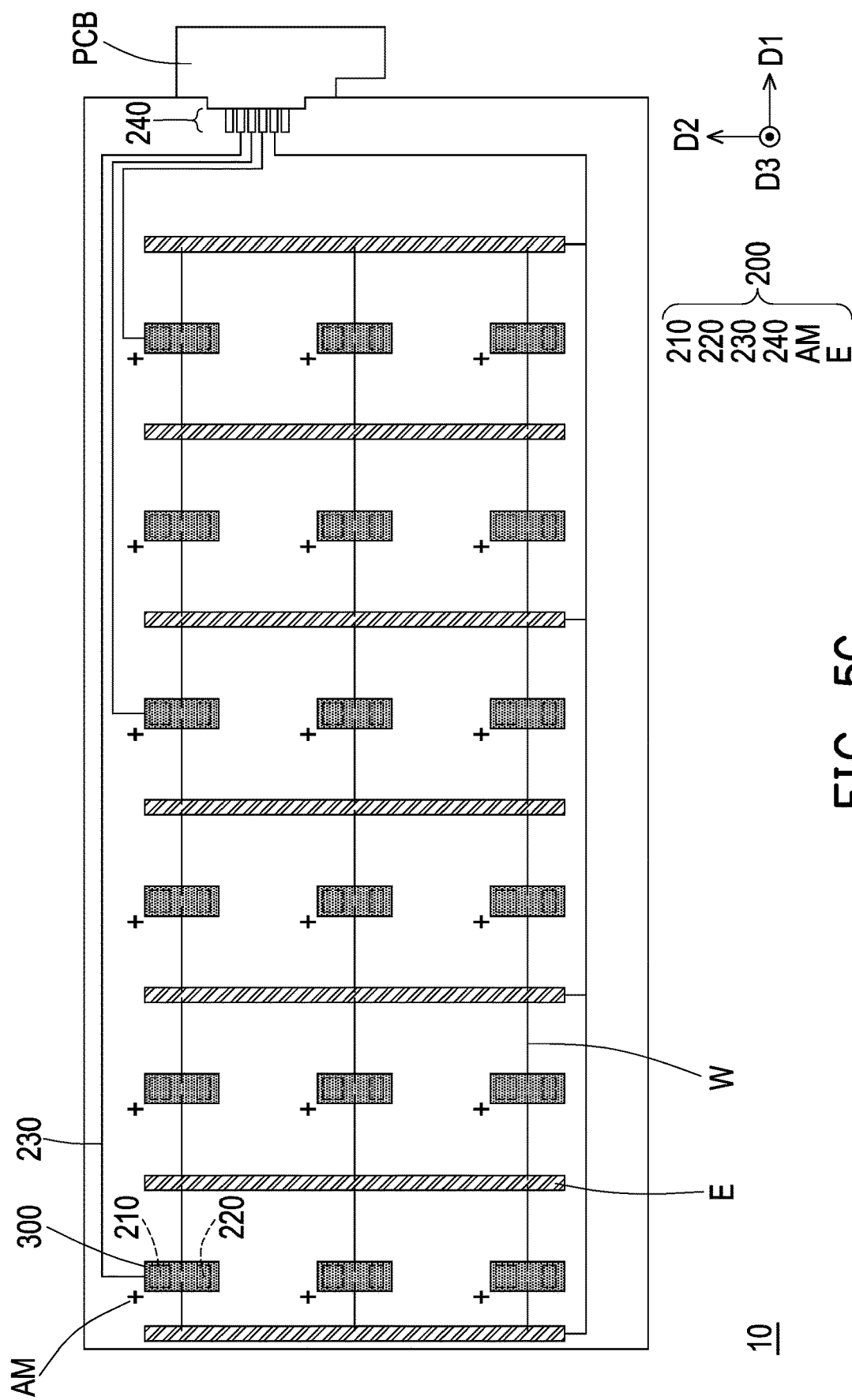
FIG. 5C is a schematic top view of a vibration generating module in a display device of yet another embodiment of the disclosure.
Figure 5F:
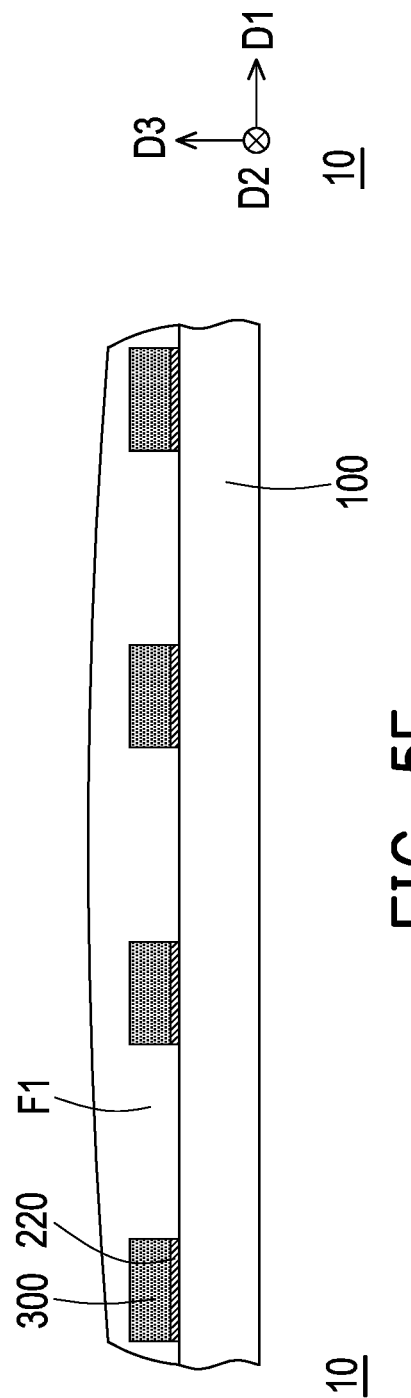
FIG. 5F is a schematic cross-sectional view of a first function layer disposed on a plurality of vibrators in a display device of another embodiment of the disclosure.
Figure 6:
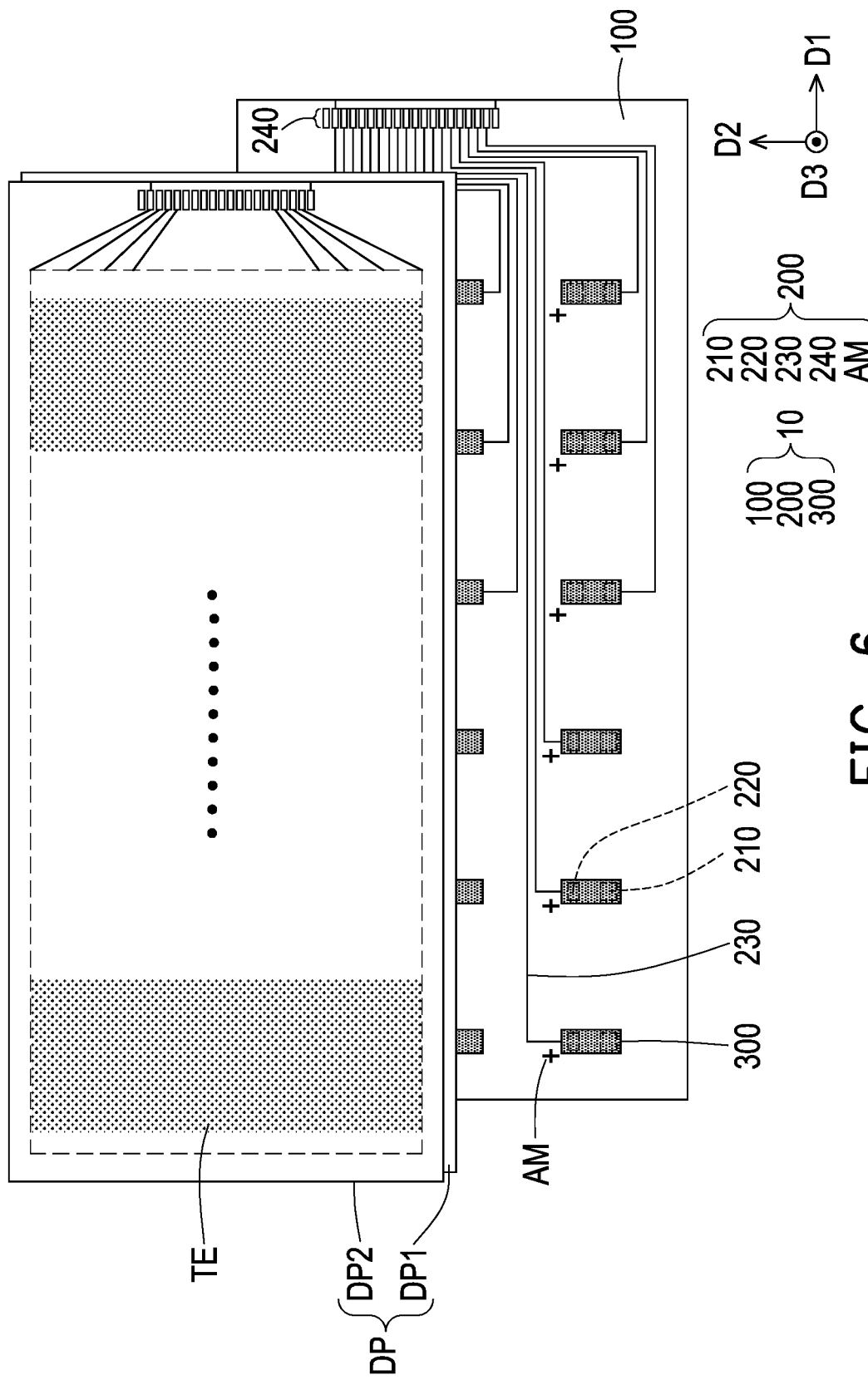
FIG. 6 is an exploded view of a display panel and a vibration generating module of a display device of an embodiment of the disclosure.

FIG. 1 is a flowchart of a partial manufacturing process of a display device of an embodiment of the disclosure. FIG. 2 is a schematic diagram of a manufacturing method of a display device of an embodiment of the disclosure. FIG. 3 is a schematic cross-sectional view of a display panel in a display device of an embodiment of the disclosure. FIG. 4A is a schematic top view of a circuit layer in a display device of an embodiment of the disclosure. FIG. 4B is a schematic top view of a circuit layer in a display device of another embodiment of the disclosure. FIG. 5A is a schematic top view of a vibration generating module in a display device of an embodiment of the disclosure. FIG. 5B is a schematic top view of a vibration generating module in the display device of another embodiment of the disclosure. FIG. 5C is a schematic top view of a vibration generating module in the display device of yet another embodiment of the disclosure. FIG. 5D is a schematic partial cross-sectional view according to FIG. 5C. FIG. 5E is a schematic cross-sectional view of a first function layer disposed on a plurality of vibrators in a display device of an embodiment of the disclosure. FIG. 5F is a schematic cross-sectional view of a first function layer disposed on a plurality of vibrators in a display device of another embodiment of the disclosure. FIG. 6 is an exploded view of a display panel and a vibration generating module of a display device of an embodiment of the disclosure.

Referring to FIG. 1 to FIG. 6 at the same time, step S100 in the present embodiment is to provide a display panel DP. In some embodiments, as shown in FIG. 6, the display panel DP may include a display unit DP1 and a touch unit DP2, but the disclosure is not limited thereto. As shown in FIG. 3, in some embodiments, the display unit DP1 may include a substrate SB, a circuit layer AC, a plurality of light-emitting elements LE, a stopping wall SW, and a fill layer FL. The touch unit DP2 may include a plurality of touch electrodes TE, but the disclosure is not limited thereto.

In some embodiments, the material of the substrate SB may include glass, plastic, ceramic, quartz, sapphire, or a combination thereof. For example, the material of the substrate SB may include polymethyl methacrylate (PMMA), polycarbonate (PC), polyimide (PI), polyethylene terephthalate (PET), or other suitable materials or a combination of the above materials, but the disclosure is not limited thereto.

Please continue to refer to FIG. 3. The circuit layer AC is disposed on the substrate SB, for example. In some embodiments, the circuit layer AC includes a circuit structure configured to drive the plurality of light-emitting elements LE. For example, the circuit layer AC may include a plurality of scan lines, a plurality of data lines, a plurality of active elements, a plurality of signal lines, and/or a plurality of electrodes, a drive unit (such as GOP, gate-on-panel), or a combination thereof, but the disclosure is not limited thereto. In some embodiments, the plurality of light-emitting elements LE are, for example, disposed on the circuit layer AC, and the stopping wall SW is also, for example, disposed on the circuit layer AC and may be configured to define the plurality of light-emitting elements LE. The plurality of light-emitting elements LE may be disposed on the circuit layer AC in an array, staggered arrangement (for example, pentile mode), or in other manners, but the disclosure is not limited thereto.

In some embodiments, the plurality of light-emitting elements LE may be electrically connected to the active elements through pads (not shown), respectively. In some embodiments, the plurality of light-emitting elements LE may include a light-emitting diode (LED), such as an organic LED (OLED), a micro LED, a mini LED, a quantum dot LED (QLED, QDLED), or fluorescence, phosphorescence, quantum dot (QD), other suitable materials, or a combination of the above materials, but the disclosure is not limited thereto. In other embodiments, the plurality of light-emitting elements LE may include a non-self-light-emitting material, such as liquid crystal or other suitable media. In the case where the plurality of light-emitting elements LE include a non-self-luminous material, the display panel DP may further include a backlight module (not shown). The backlight module may be a direct-lit backlight module or an edge-lit backlight module, but the disclosure is not limited thereto.

The fill layer FL is, for example, disposed on the plurality of light-emitting elements LE and the stopping wall SW, and may be configured to fix or protect the plurality of light-emitting elements LE. In some embodiments, the fill layer FL may include a transparent material, an organic insulating material, or an inorganic insulating material, such as epoxy resin, acrylic, other suitable materials, or a combination of the above. In some embodiments, the fill layer FL may include a single layer structure or a composite layer structure.

The plurality of touch electrodes TE are, for example, disposed on the fill layer FL. The forming method of the touch electrodes TE may be, for example, a sputtering method, but the disclosure is not limited thereto. In some embodiments, the touch electrodes TE may be a transparent conductive material layer, but are not limited thereto. In other embodiments, the touch electrodes TE may be an opaque conductive material layer.

Moreover, as shown in FIG. 2, a cover plate CP may be disposed on the surface of the substrate SB provided with a member such as the circuit layer AC to reduce the influence of the external environment on the members inside the display panel DP.

Step S200 of the present embodiment is to form a vibration generating module 10, including the following steps.

First, in step S210 of the present embodiment, a substrate 100 is provided. In some embodiments, the material of the substrate 100 may include glass, plastic, ceramic, quartz, sapphire, or a combination thereof. For example, the material of the substrate 100 may include polymethyl methacrylate (PMMA), polycarbonate (PC), polyimide (PI), polyethylene terephthalate (PET), or other suitable materials or a combination of the above materials, but the disclosure is not limited thereto.

Next, in step S220 of the present embodiment, a circuit layer 200 is formed on the substrate 100. In some embodiments, the circuit layer 200 may include a plurality of wires, pads, active elements, drive units (e.g., GOP, gate-on-panel), or a combination thereof. In addition, in the present embodiment, an active element, a drive unit, an alignment mark, and a circuit board may also be disposed on the substrate 100. For example, as shown in FIG. 4A, in an embodiment, the circuit layer 200 on the substrate 100 includes a first pad 210, a second pad 220, a signal transmission line 230, a third pad 240, and an alignment mark AM. The first pad 210 and the second pad 220 may, for example, be disposed in a region 300R where a vibrator is to be disposed later, and are, for example, configured to be electrically connected to the vibrator. For example, the first pad 210 and the second pad 220 may be electrically connected to the vibrator through an external electrode terminal of the vibrator, but the disclosure is not limited thereto. The signal transmission line 230 may, for example, be electrically connected to the second pad 220 and a circuit board PCB, so that the vibrator subsequently electrically connected to the second pad 220 receives the signal from the circuit board PCB. The circuit board PCB is electrically connected to the signal transmission line 230 through the third pad 240, for example. In some embodiments, the circuit board PCB may be disposed at a side of the substrate 100, but the disclosure is not limited thereto. In some embodiments, the circuit board PCB may include a rigid circuit board or a flexible circuit board. For example, the circuit board PCB may be a flexible printed circuit board (FPC). In addition, the circuit board PCB may, for example, further include a driver chip (not shown) and a connector (not shown), but the disclosure is not limited thereto. The alignment mark AM is configured, for example, to enable the vibrator to be formed later to be more accurately disposed on the desired position. It should be mentioned that, one alignment mark AM may be configured, for example, to correspond to the location of one vibrator; or one alignment mark AM may be configured, for example, to correspond to a location of a column, a row, or one array of vibrators, but the disclosure is not limited thereto. For example, in some embodiments, the alignment mark AM may be applied to the attachment alignment between the substrate 100 and the display panel DP. In addition, although FIG. 4A shows that the alignment mark AM has a cross-shaped pattern, the alignment mark AM may have patterns of other shapes. In addition, the material of the alignment mark AM is not particularly limited, as long as the identification effect meets the required material.

The circuit layer 200 is not limited to the embodiments described in the above embodiment. For example, in some other embodiments, as in the embodiment of the circuit layer 200 shown in FIG. 4B, the circuit layer 200 on the substrate 100 may include the first pad 210, the second pad 220, an active element TFT, a scan line SL, a data line DL, a common electrode line COM, the alignment mark AM, a gate driver GD, and a data driver DD. Regarding the technical content of the first pad 210, the second pad 220, the circuit board PCB, and the alignment mark AM, please refer to the above embodiment, which is not repeated herein. The active element TFT includes, for example, a gate G, a source S, a drain D, and a semiconductor layer SE and is configured to drive a vibrator to be provided later, wherein the drain D is electrically connected to the second pad 220. The scan line SL, for example, is extended toward the first direction D1 and is electrically connected to the gate G in the active element TFT, and the data line DL, for example, is extended toward a second direction D2 and electrically connected to the source S in the active element TFT, wherein the first direction D1 may be different from the second direction D2. As shown in FIG. 4B, the first direction D1 may be substantially perpendicular to the second direction D2. In addition, the first direction D1 and the second direction D2 may each be substantially perpendicular to the normal direction of the substrate 100 (a third direction D3). The common electrode line COM, for example, is extended toward the first direction D1 and is electrically connected to the first pad 210. The gate driver GD and the data driver DD, for example, are respectively located at the first side and the second side of the substrate 100, wherein the first side may be perpendicular to the second side, but the disclosure is not limited thereto. The gate driver GD is, for example, electrically connected to the scan line SL, and transmits a signal to the active element TFT through the scan line SL. The gate driver GD is, for example, electrically connected to the scan line SL, and transmits the corresponding gate signal to the active element TFT through the scan line SL. The data driver DD is, for example, electrically connected to the data line DL, and transmits the corresponding data signal to the active element TFT through the data line DL.

Please refer to FIG. 1 and FIG. 5A to FIG. 5E. In step S230 of the present embodiment, a plurality of vibrators 300 are placed on the substrate 100, wherein the plurality of vibrators 300 are electrically connected to the circuit layer 200. The plurality of vibrators 300 may be arranged in an array of M×N, and, for example, in the present embodiment, are arranged in a 3×6 matrix, but the disclosure is not limited thereto. In addition, each of the plurality of vibrators 300 may be electrically connected to the circuit layer 200 through at least one pad. In the present embodiment, the vibrators 300 may be applied to tactile feedback or a combination of tactile feedback and sound feedback. For example, the vibrators 300 may include a member such as a piezoelectric element, a brake, an ultrasonic sensor, a pressure sensor, or a combination thereof, but the disclosure is not limited thereto. Specifically, in the present embodiment, as shown in FIG. 5A and FIG. 5B, the plurality of vibrators 300 may include external electrode terminals (not shown), and the plurality of vibrators 300 are electrically connected to the first pad 210 and the second pad 220 disposed on the substrate 100 through the external electrode terminals. In some embodiments, the manner in which the plurality of vibrators 300 are electrically connected to the first pad 210 and the second pad 220 may be electrically connecting the external electrode terminals of the plurality of vibrators 300 and the first pad 210 and the second pad 220 through a conductive adhesive (not shown) disposed on the surface between the two or by soldering and hot pressing the surface between the two, but the disclosure is not limited thereto. The material of the conductive adhesive may include anisotropic conductive film (ACF), conductive silver adhesive, other suitable materials, or a combination of the above materials, but the disclosure is not limited thereto. In addition, the vibrators 300 shown in FIG. 5A are a passively driven embodiment, and the vibrators 300 shown in FIG. 5B are an actively driven embodiment.

In some other embodiments, as shown in FIG. 5C and FIG. 5D, the difference from the vibration generating module 10 shown in FIG. 5A is: the circuit layer 200 on the substrate 100 may further include a plurality of electrodes E, and a plurality of wires W electrically connected to the circuit layer 200 are also disposed on the substrate 100. The plurality of electrodes E, for example, are extended toward a specific direction and are electrically connected to the signal transmission line 230, and the specific direction (for example, the direction D2) may be substantially perpendicular to the extending direction (for example, the direction D1) of the signal transmission line 230, but is not limited thereto. The plurality of wires W are disposed on the circuit layer 200 and the plurality of vibrators 300, for example. In some embodiments, each of the plurality of vibrators 300 is electrically connected to the circuit layer 200 through at least one of the wires W. Specifically, the plurality of wires W are disposed on the circuit layer 200 and the plurality of vibrators 300, and are each electrically connected to the corresponding electrode E and the corresponding vibrator 300, wherein one of the wires W electrically connected to the electrode E and the vibrator 300 is shown in FIG. 5C and FIG. 5D, the disclosure is not limited thereto. Accordingly, the vibrators 300 may be electrically connected to the circuit board PCB through the arrangement of the wires W and the electrodes E to receive the corresponding signal.

In the embodiment shown in FIG. 5E and FIG. 5F, the vibration generating module 10 may further optionally include a first function layer F1 disposed on the vibrators 300, so that the vibrators 300 may be firmly fixed on the substrate 100. In particular, the first function layer F1 may be a discontinuous layer as shown in FIG. 5E, such as an adhesive tape, or a continuous layer as shown in FIG. 5F, such as an adhesive layer, but the disclosure is not limited thereto. The first function layer F1 may also have the following embodiments, for example. In some embodiments, the first function layer F1 may, for example, include a material having high hardness characteristics. For example, the first function layer F1 may include a coating (not shown) having a pencil hardness greater than 5H or other suitable materials. That is, the first function layer F1 may be used as a support layer, a protective layer, or a buffer layer. In some other embodiments, the first function layer F1 may, for example, include a material of an anti-glare or optical matching layer. The optical matching layer may, for example, include a plurality of film layers having different refractive indices, to alleviate the issue that the circuit layer interferes with the image display of the display panel under the irradiation of ambient light. In still other embodiments, the first function layer F1 may include a pressure sensing layer or a piezoelectric sensing layer. In further embodiments, the first function layer F1 may include a heat dissipation layer. In addition, in some embodiments, the first function layer F1 may include a single layer or a plurality of layers of the above, but the disclosure is not limited thereto.

Then, step S240 of the present embodiment may be optionally performed to test each of the plurality of vibrators 300 to determine whether each of the plurality of vibrators 300 is qualified or unqualified. The performance of a plurality of vibrators is tested before the vibration generating module is attached to the display panel, thus reducing the number of vibrator adhesion and vibrator testing. In this way, the process efficiency of the display device of an embodiment of the disclosure may be increased or the manufacturing cost of the display device of an embodiment of the disclosure may be reduced. The method of testing the plurality of vibrators 300 may be, for example, performing electrical measurement or vibration test on the vibrators 300 using a detection device (such as a detection device 1000 in FIG. 2) to detect the performance of the vibrators 300, but the disclosure is not limited thereto. For example, in electrical measurement, the vibrators 300 are detected using a detection circuit, a processing circuit, or other members; or in the vibration test, the vibration signal generated by the vibrators 300 or the vibration superimposed signal generated by the plurality of vibrators 300 is detected, but the disclosure is not limited thereto. After the plurality of vibrators 300 are tested, if any unqualified vibrators are found, the unqualified vibrators are removed from the substrate 100, or the electrical connection with the unqualified vibrators is cut off.

Please refer to FIG. 6. It may be seen from the manufacturing steps S210 to S240 that the vibration generating module 10 at least includes the substrate 100, the circuit layer 200, and the plurality of vibrators 300, but is not limited thereto. After the vibration generating module 10 is formed, in step S250 of the present embodiment, the vibration generating module is attached to the display panel. For example, as shown in FIG. 2, the substrate 100 including the vibration generating module 10 is attached to the display panel DP, thereby alleviating the issue of poor yield and efficiency caused by directly attaching a plurality of vibrators to the back of the display panel. In some embodiments, the substrate 100 and the display panel DP are attached to each other through an adhesive layer AL disposed therebetween, but the disclosure is not limited thereto. In other embodiments, the substrate 100 and the display panel DP may be attached to each other by using electrostatic force. The material of the adhesive layer AL may include, for example, an optical clear resin (OCR) or optical clear adhesive (OCA), for example, including acrylic resin, silicone resin, epoxy resin, or other suitable materials or a combination of the above materials, but the disclosure is not limited thereto.

So far, the manufacture of the display device of the disclosure is completed. It is worth noting that although the manufacturing method of the display device of the present embodiment is described by taking the above method as an example; the forming method of the display device of the disclosure is not limited thereto.

Figure 7A:
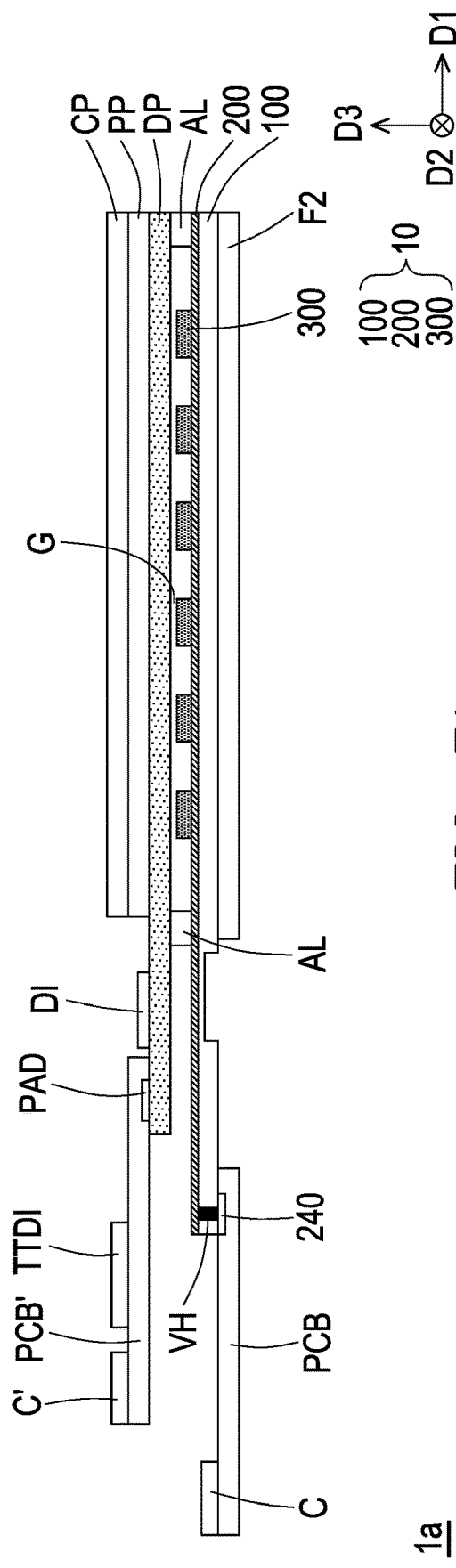
FIG. 7A is a schematic cross-sectional view of the display device of the first embodiment of the disclosure.
Figure 7B:
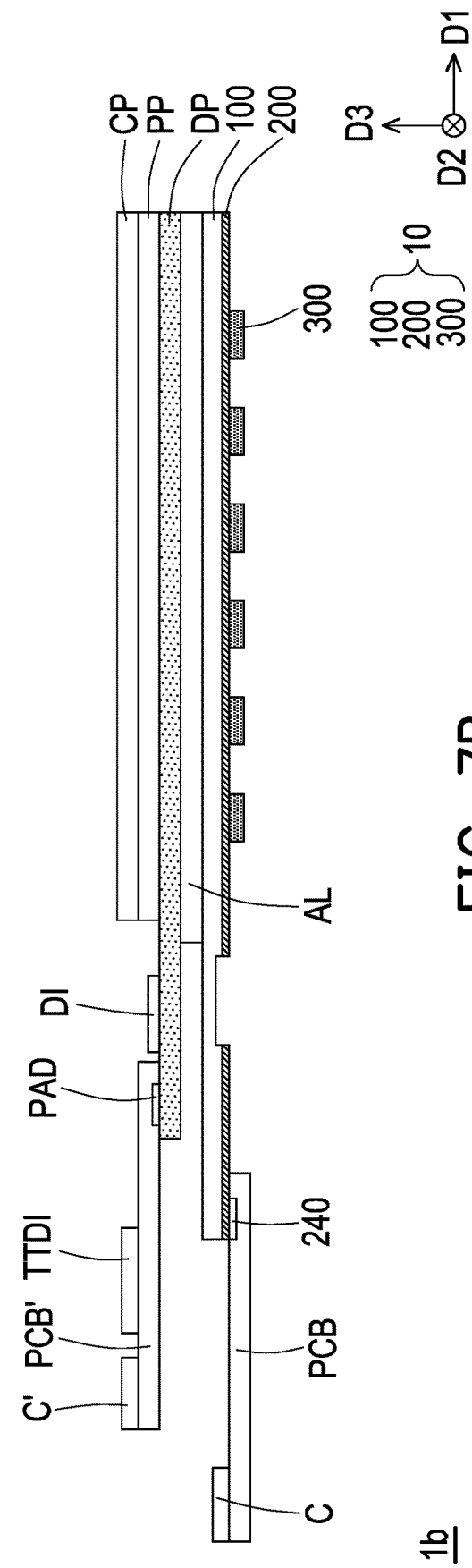
FIG. 7B is a schematic cross-sectional view of the display device of the second embodiment of the disclosure.

FIG. 7A is a schematic cross-sectional view of the display device of the first embodiment of the disclosure. FIG. 7B is a schematic cross-sectional view of the display device of the second embodiment of the disclosure.

Referring to FIG. 7A, a display device 1a of the present embodiment includes the display panel DP and the vibration generating module 10, wherein the display panel DP and the vibration generating module 10 are attached to each other through the adhesive layer AL. In some embodiments, the display panel DP includes at least the display unit DP1 and touch unit DP2, wherein the members included in the display unit and the touch control unit and the connection relationships and functions thereof are as provided in the above embodiments, and are not repeated herein. In the present embodiment, a side of the substrate 100 on which the vibrators 300 are disposed faces the display panel DP. That is, the plurality of vibrators 300 of the present embodiment are disposed between the display panel DP and the substrate 100, but the disclosure is not limited thereto. The display device 1a of the present embodiment may further include a polarizing plate PP, a cover plate CP, and a circuit board PCB', but the disclosure is not limited thereto. The cover plate CP is disposed on the circuit layer of the display panel DP. That is, the cover plate CP and the vibration generating module 10 are disposed at opposite sides of the display panel DP. The polarizing plate PP is disposed, for example, between the display panel DP and the cover plate CP. The circuit board PCB' is, for example, disposed on at least one side of the display panel DP, and may be electrically connected to the circuit layer of the display panel DP, for example, through a pad PAD, but the disclosure is not limited thereto. In some embodiments, the circuit board PCB' may include a rigid circuit board or a flexible circuit board, such as a flexible printed circuit board, but the disclosure is not limited thereto. In the present embodiment, the circuit board PCB' may be further provided with a chip TTDI (for example, a chip integrating touch and drive functions, but not limited thereto) and a connector C'. The chip TTDI is, for example, disposed on the circuit board PCB' and is electrically connected to the circuit board PCB'. In some embodiments, the chip TTDI may control the light-emitting elements (not shown in the present embodiment) through the circuit layer of the display panel DP, and/or may determine the touch position according to the touch signal from the outside and send a corresponding signal. The connector C' may, for example, include a plurality of terminals, and other external electronic elements (not shown) may be electrically connected to the circuit board PCB' through the terminals. In the present embodiment, the display device 1a further includes a drive circuit chip DI. The drive circuit chip DI may be disposed on the display panel DP, for example, but the disclosure is not limited thereto.

Moreover, in the embodiment shown in FIG. 7A, the display device 1a may optionally further include a second function layer F2, wherein the second function layer F2 is disposed on a side of the substrate 100 opposite to the plurality of vibrators 300. The material included in the second function layer F2 and the function thereof are as provided in the first function layer F1 in the above embodiments, and are not repeated in the present embodiment. In some embodiments, the material of the second function layer F2 and the function thereof may be the same as or similar to those of the first function layer F1; or the material of the second function layer F2 and the function thereof may be different from those of the first function layer F1. For example, the second function layer F2 may include a heat dissipation layer, which is not repeated in the present embodiment. In some embodiments, the display device 1a may include the first function layer F1 and the second function layer F2 disposed at opposite sides of the vibration generating module 10 at the same time, but the disclosure is not limited thereto.

The vibration generating module 10 may, for example, include the substrate 100, the circuit layer 200, and the plurality of vibrators 300. In addition, the vibration generating module 10 is responsive to the signal from the touch unit of the display panel DP by being electrically connected to the display panel DP. The circuit layer 200 and the plurality of vibrators 300 are, for example, disposed on the substrate 100, and the plurality of vibrators 300 are, for example, electrically connected to the circuit layer 200. In some embodiments, the vibration generating module 10 further includes the circuit board PCB, and the circuit board PCB and other portions of the circuit layer 200 may be electrically connected to each other through the third pad 240. It should be noted that the third pad 240 may be located at the same side or a different side of the substrate 100 as other portions of the circuit layer 200 depending on the design. When the third pad 240 and other portions of the circuit layer 200 are at different sides, the two may be electrically connected through a through hole VH, as shown in FIG. 7A. The circuit board PCB includes at least a connector C, but the disclosure is not limited thereto. The connector C may, for example, include a plurality of terminals, similar to the connector C', and other external electronic elements (not shown) may be electrically connected to the circuit board PCB through the terminals. In addition, the rest of the members included in the vibration generating module 10 and the connection relationships and functions thereof are as provided in the above embodiments, and are not repeated herein. It should be mentioned that, the plurality of vibrators 300 of the present embodiment are not in direct contact with the display panel DP. That is, there is a gap G between the plurality of vibrators 300 and the display panel DP to prevent the performance of the vibrators 300 from being affected by the contact between the vibrators 300 and the display panel DP.

In the embodiment of a display device 1b as shown in FIG. 7B, a side of the substrate 100 on which the vibrators 300 are provided faces away from the display panel DP. That is, the substrate 100 of the vibration generating module 10 is disposed between the display panel DP and the plurality of vibrators 300 of the vibration generating module 10, thus reducing the overall thickness of the display device.

Moreover, after the substrate 100 of the vibration generating module 10 is attached to the display panel DP, subsequent processes may be performed to electrically connect the vibration generating module 10 and the display panel DP. The disclosure does not limit the subsequent processes to be performed.

Figure 8:
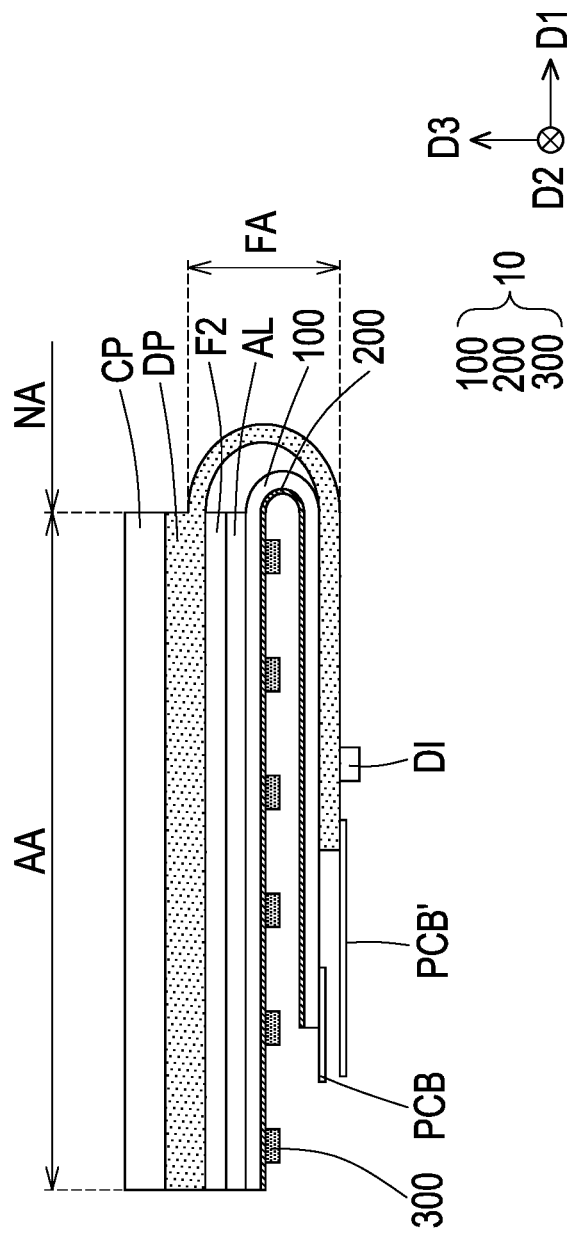
FIG. 8 is a schematic cross-sectional view of the display device of the third embodiment of the disclosure.

FIG. 8 is a schematic cross-sectional view of the display device of the third embodiment of the disclosure.

FIG. 8 shows a manner of electrically connecting the display panel DP and the vibration generating module 10 in a display device 1c of the present embodiment. As shown in FIG. 8, the display panel DP includes a display area AA and a non-display area NA. A portion of the non-display area NA that may be bent is overlapped with a folding area FA, and the vibration generating module 10 may also be bent. When bent, the display panel DP and the vibration generating module 10 may be in contact with each other, and the display panel DP and the vibration generating module 10 may be electrically connected to each other through wires (not shown) or a conductive adhesive (not shown) provided thereon. Accordingly, the vibration generating module 10 may be responsive to the signal from the touch unit of the display panel DP. For example, the vibration generating module 10 vibrates to feed back the signal. That is, the vibrators 300 of the present embodiment are applied to tactile feedback, but the disclosure is not limited thereto.

Figure 9A:
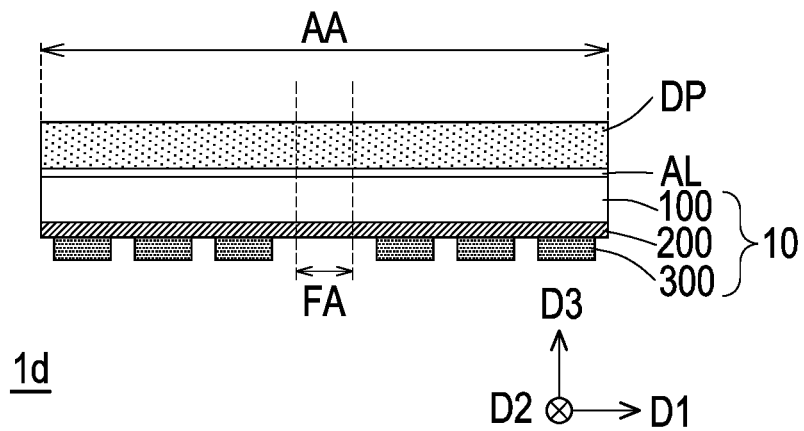
FIG. 9A is a schematic cross-sectional view of the display device of the fourth embodiment of the disclosure.
Figure 9B:
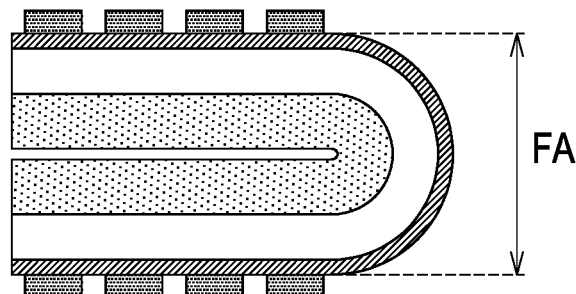
FIG. 9B is a schematic cross-sectional view of the display device of the fourth embodiment of the disclosure after being folded.
Figure 9C:
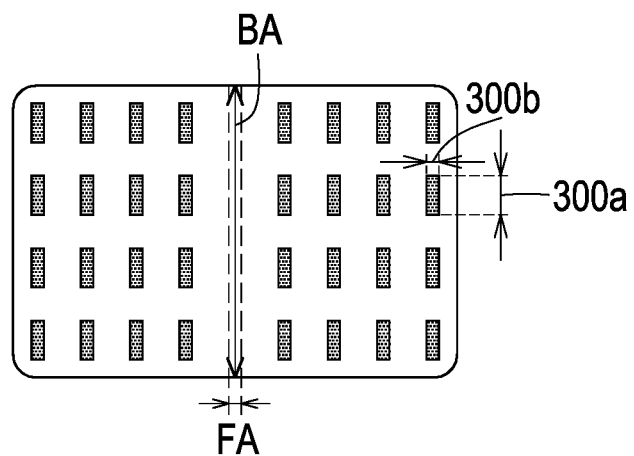
FIG. 9C is a schematic top view of the display device of the fourth embodiment of the disclosure.

FIG. 9A is a schematic cross-sectional view of the display device of the fourth embodiment of the disclosure. FIG. 9B is a schematic cross-sectional view of the display device of the fourth embodiment of the disclosure after being folded. FIG. 9C is a schematic top view of the display device of the fourth embodiment of the disclosure.

FIG. 9A and FIG. 9C show a display device 1d of an embodiment of the disclosure. The display device 1d of the present embodiment is a foldable display device. That is, the display device 1d includes the folding area FA and has a folding axis BA, and the display area AA is overlapped with the folding area FA. In the present embodiment, the plurality of vibrators 300 are not disposed in the folding area FA, so as to reduce the probability of damage to the display device 1d after being folded. Moreover, the plurality of vibrators 300 (at least two vibrators) are arranged in an array, for example, and are arranged along the folding axis BA of the display device 1d, for example. Specifically, the vibrators 300 may be, for example, rectangles with a long side 300a and a short side 300b, wherein the extending direction of the long side 300a of the vibrators 300 is, for example, parallel to the folding axis BA, but the disclosure is not limited thereto. In other embodiments, the vibrators 300 may have an irregular shape or other symmetrical shapes, but the disclosure is not limited thereto.

Figure 10A:
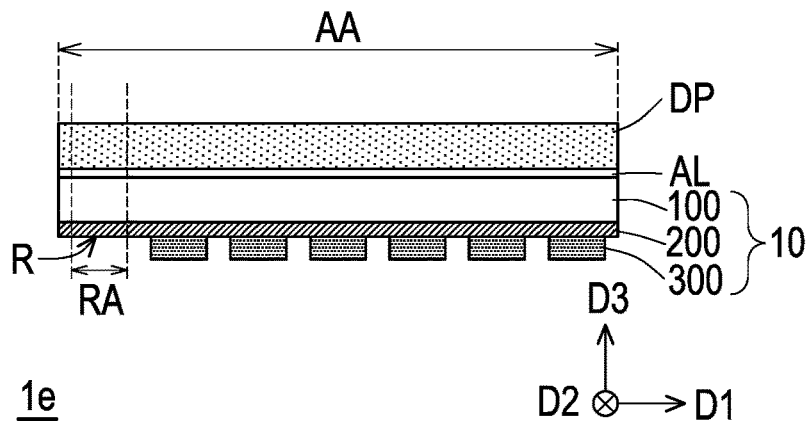
FIG. 10A is a schematic cross-sectional view of the display device of the fifth embodiment of the disclosure.
Figure 10B:
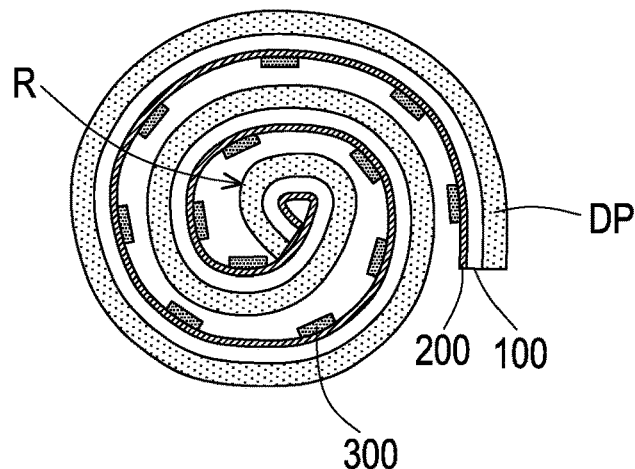
FIG. 10B is a schematic cross-sectional view of the display device of the fifth embodiment of the disclosure after being rolled up.
Figure 10C:
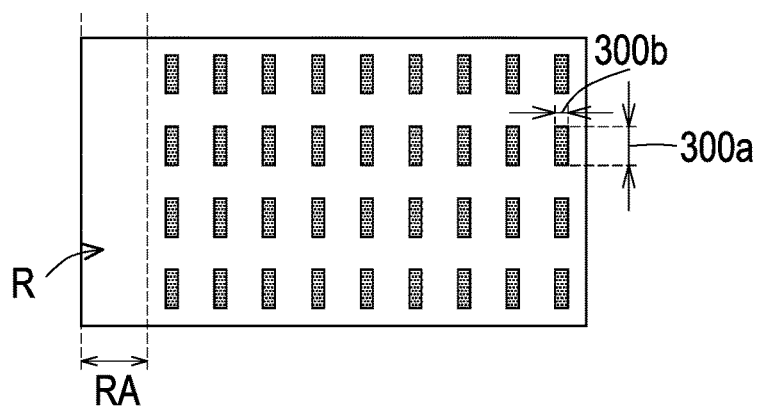
FIG. 10C is a schematic top view of the display device of the fifth embodiment of the disclosure.

FIG. 10A is a schematic cross-sectional view of the display device of the fifth embodiment of the disclosure. FIG. 10B is a schematic cross-sectional view of the display device of the fifth embodiment of the disclosure after being rolled up. FIG. 10C is a schematic top view of the display device of the fifth embodiment of the disclosure.

FIG. 10A and FIG. 10C show a display device 1e of an embodiment of the disclosure. The display device 1e of the present embodiment is a reel-type display device. That is, the display device 1e includes a reel core R. As shown in FIG. 10B, a region RA is overlapped with a side of the display area AA. When the display device is rolled into a cylindrical shape, the region RA may be close to the center of the cylinder, and the reel core R may be located in the region RA, but the disclosure is not limited thereto. In some embodiments, the shape of the reel core R may be, for example, a rod-shaped physical reel extended along the rolling axis, but the disclosure is not limited thereto. In the present embodiment, the plurality of vibrators 300 are not disposed in the region RA of the reel core R, so as to reduce the probability of damage due to the display device 1e being rolled up. In addition, the plurality of vibrators 300 (at least two vibrators) are arranged in an array, for example, and are arranged along the extending direction of the reel core R, for example. Specifically, the vibrators 300 may be, for example, rectangles with the long side 300a and the short side 300b, wherein the extending direction of the long side 300a of the vibrators 300 is, for example, parallel to the extending direction of the reel core R, but the disclosure is not limited thereto.

Figure 11A:
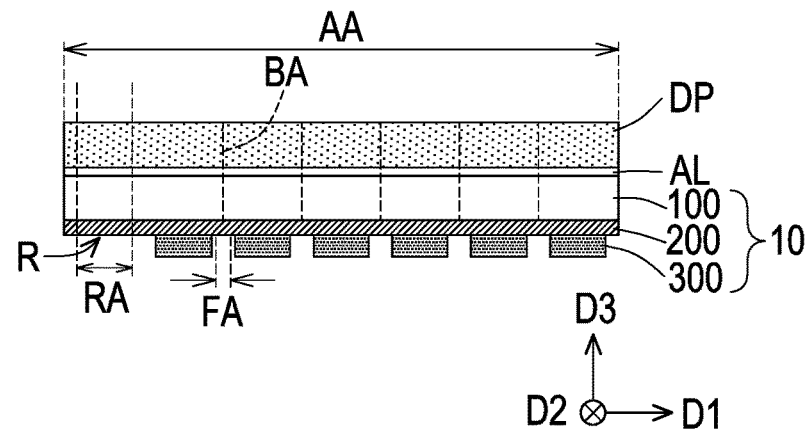
FIG. 11A is a schematic cross-sectional view of the display device of the sixth embodiment of the disclosure.
Figure 11B:
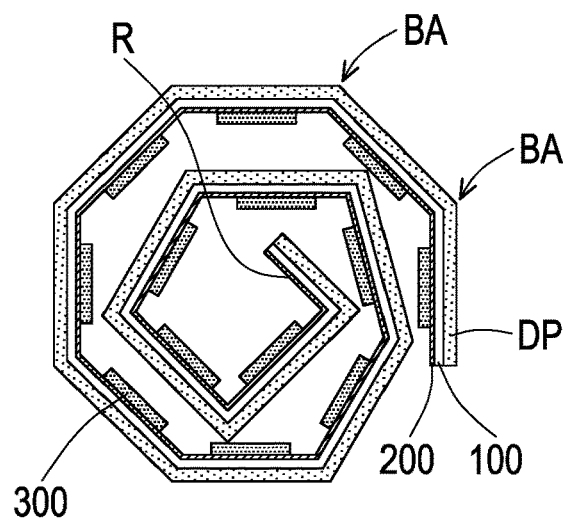
FIG. 11B is a schematic cross-sectional view of the display device of the sixth embodiment of the disclosure after being rolled up and folded.
Figure 11C:
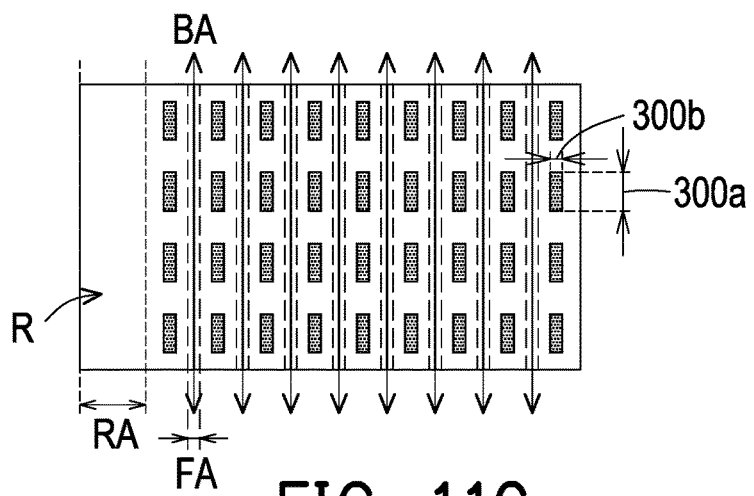
FIG. 11C is a schematic top view of the display device of the sixth embodiment of the disclosure.

FIG. 11A is a schematic cross-sectional view of the display device of the sixth embodiment of the disclosure. FIG. 11B is a schematic cross-sectional view of the display device of the sixth embodiment of the disclosure after being rolled up and folded. FIG. 11C is a schematic top view of the display device of the sixth embodiment of the disclosure.

FIG. 11A and FIG. 11C show a display device 1f of an embodiment of the disclosure. The display device 1f of the present embodiment is a fold 'n' roll display device. That is, the display device 1f also includes a plurality of folding areas FA and has a plurality of folding axes BA. More specifically, one folding axis BA may be located in one folding area FA. Similar to the embodiment of FIG. 10A to FIG. 10C, when the display device is rolled into a cylindrical body, the region RA may be close to the center of the cylindrical body, and the reel core R may be located in the region RA. The shape of the reel core R may also be a rod-shaped physical reel, but the disclosure is not limited thereto. In the present embodiment, the plurality of vibrators 300 are not disposed in the folding areas FA and the region RA of the reel core R, so as to reduce the probability of damage due to the display device 1f being folded or rolled up. Moreover, the plurality of vibrators 300 (at least two vibrators) are arranged in an array, for example, and are arranged along the folding axes BA of the display device 1f and the extending direction of the reel core R, for example. Specifically, the vibrators 300 may be, for example, rectangles with the long side 300a and the short side 300b, wherein the extending direction of the long side 300a of the vibrators 300 is, for example, parallel to the folding axes BA and the extending direction of the reel core R, but the disclosure is not limited thereto.

Figure 12A:
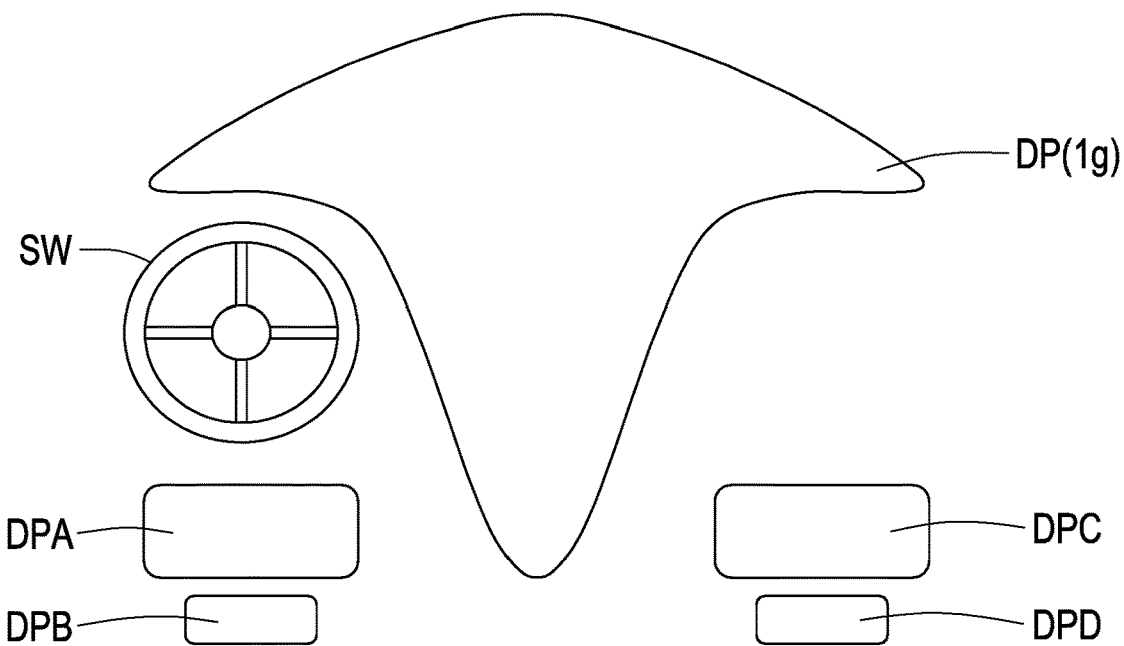
FIG. 12A is a schematic front view of the display device of the seventh embodiment of the disclosure.
Figure 12B:
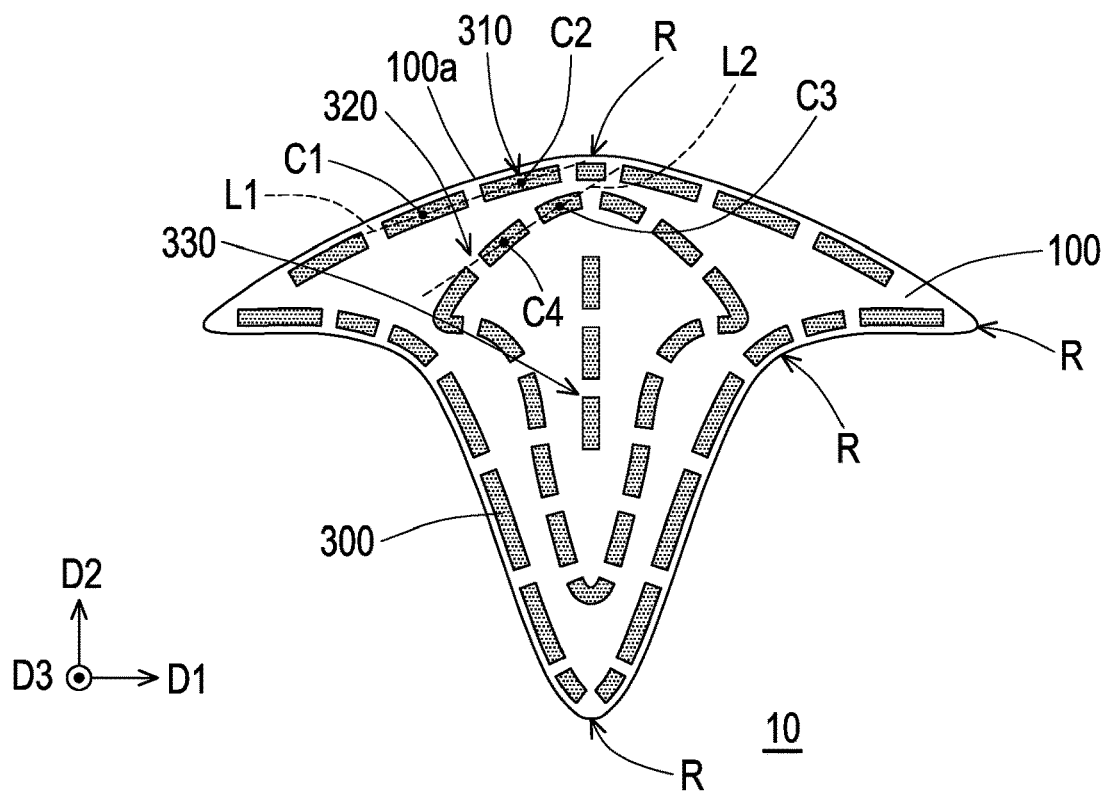
FIG. 12B is a schematic back view of the display device of the seventh embodiment of the disclosure.

FIG. 12A is a schematic front view of the display device of the seventh embodiment of the disclosure. FIG. 12B is a schematic back view of the display device of the seventh embodiment of the disclosure.

FIG. 12A and FIG. 12B show a display device 1g of an embodiment of the disclosure. The display device 1g of the present embodiment is a vehicle display device, and may be disposed at a dashboard or a center console, for example. The display device 1g has a shape matching the design of the vehicle. Moreover, a display device may also be disposed at other positions in the vehicle (for example, the side of the driver's seat and the side of the front passenger's seat facing the rear seat), such as display devices DPA, DPB, DPC, and DPD as shown in FIG. 12A. In the present embodiment, the contour of the substrate 100 of the vibration generating module 10 is similar to that of the display panel DP, and a portion of the vibrators 310 (at least two vibrators) of the plurality of vibrators 300 may be arranged along the edge of the substrate 100 at the back of the display panel DP. More specifically, when the vibrators 310 are arranged along a certain element (such as a folding axis, a reel core, the edge of the substrate 100, or other vibrators), taking the edge of the substrate 100 as an example, centers C1 and C2 of two adjacent vibrators 310 draw a virtual straight line L1, and edges 100a of the substrates 100 of two adjacent vibrators may be parallel to the virtual straight line L1 or the included angle thereof may be less than or equal to 20 degrees (0 degrees≤included angle≤20 degrees). Moreover, taking other vibrators as an example, centers C3 and C4 of two other adjacent vibrators draw a virtual straight line L2, and then the virtual straight line L1 and the virtual straight line L2 may be parallel or the included angle thereof may be less than or equal to 20 degrees (0 degrees≤included angle≤20 degrees).

In some embodiments, the display panel DP may have an arc profile due to the shape thereof, so that the substrate 100 has a corresponding arc angle R, wherein a vibrator 310 with a smaller size may be disposed at the arc angle R, but the disclosure is not limited thereto. Moreover, another portion of the vibrators 320 (at least two vibrators) of the plurality of vibrators 300 may be arranged along the contour formed by the arrangement of the vibrators 310. That is, the contour formed by the arrangement of the vibrators 320 is substantially similar to the contour formed by the arrangement of the vibrators 310. The difference is that the vibrators 320 are disposed in a region farther from the edge of the display panel DP. In some embodiments, the distance from the vibrators 310 to the edge of the display panel DP is 0.5 to 1 times the distance from the vibrators 320 to the edge of the display panel DP (0.5≤distance ratio<1), but the disclosure is not limited thereto. It is to be explained here that although the vibrators 320 shown in FIG. 12B are arranged to form one contour, after the vibrators 320 are arranged, a plurality of contours having substantially similar shapes may be formed. Moreover, another portion of the vibrators 330 (at least two vibrators) of the plurality of vibrators 300 may be arranged along a specific direction, and the specific direction may be determined according to, for example, the shape of the display device 1g, but the disclosure is not limited thereto.

Figure 13A:
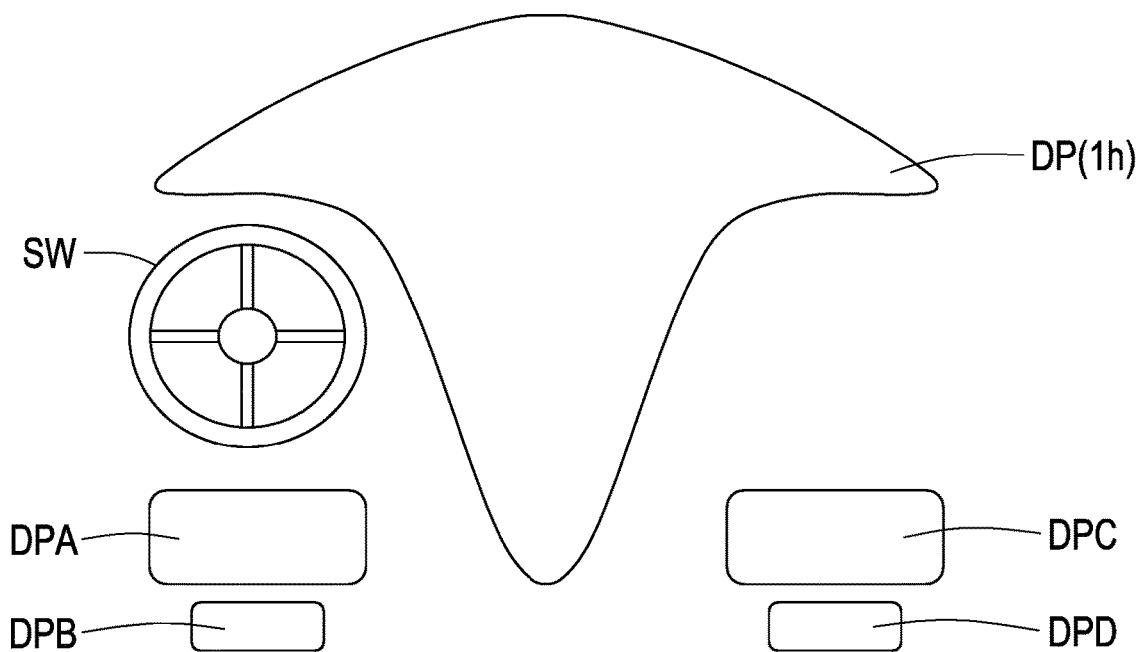
FIG. 13A is a schematic front view of the display device of the eighth embodiment of the disclosure.
Figure 13B:
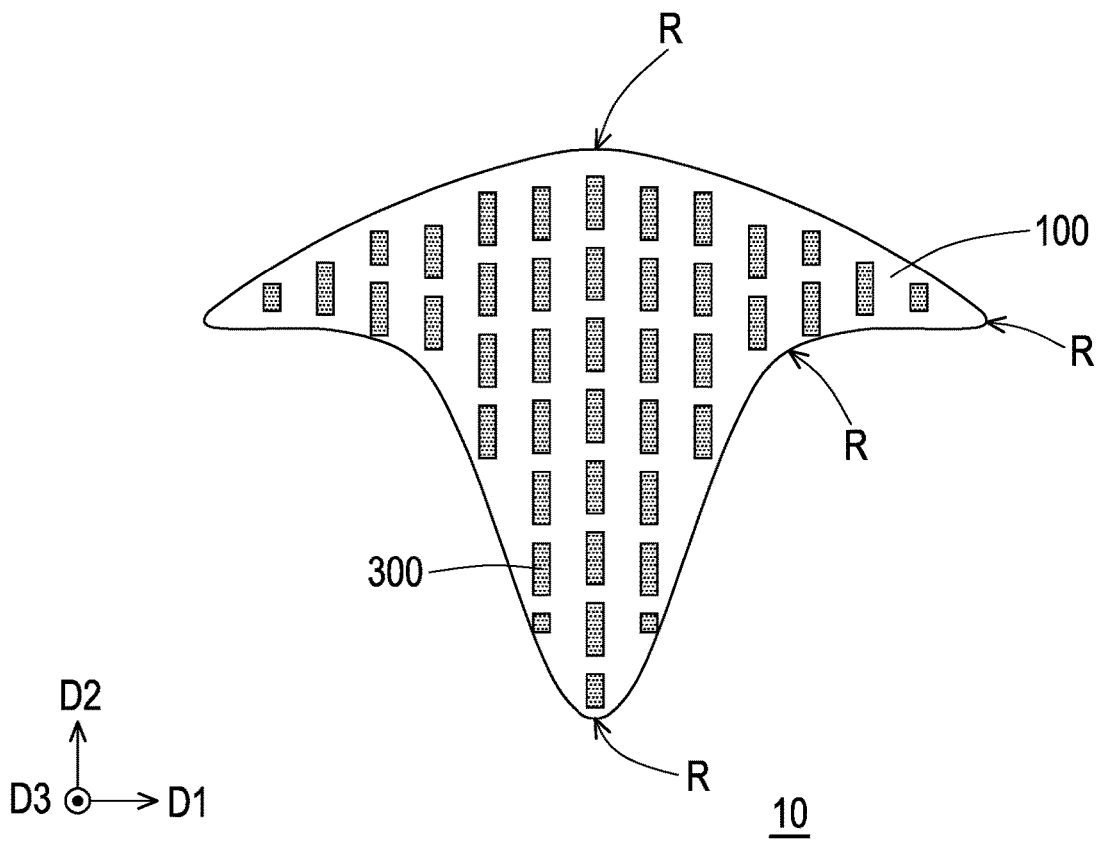
FIG. 13B is a schematic back view of the display device of the eighth embodiment of the disclosure.

FIG. 13A is a schematic front view of the display device of the eighth embodiment of the disclosure. FIG. 13B is a schematic back view of the display device of the eighth embodiment of the disclosure.

FIG. 13A and FIG. 13B show a display device 1h of an embodiment of the disclosure. The display device 1h of the present embodiment is also a vehicle display device. The difference from the display device 1g is that the vibrators 300 are divided into a plurality of groups, and each group may be extended and be arranged toward the same specific direction. The number of groups and the specific direction may be determined, for example, according to the shape of the display device 1h, but the disclosure is not limited thereto. Moreover, the display device 1h may have the arc angle R due to the shape thereof, wherein a vibrator 300 with a smaller size may be disposed at the arc angle R, but the disclosure is not limited thereto.

According to the above, in the embodiments of the disclosure, a vibration generating module is formed by disposing a plurality of vibrators on a substrate, and attaching the vibration generating module to the display panel. As a result, the issue of poor yield and poor efficiency caused by directly attaching a plurality of vibrators to the back of the display panel may be alleviated. Moreover, in the embodiments of the disclosure, the performance of a plurality of vibrators is tested before the vibration generating module is attached to the display panel, thus reducing the number of vibrator adhesion and vibrator testing. In this way, the process efficiency of the display device of an embodiment of the disclosure may be increased or the manufacturing cost of the display device of an embodiment of the disclosure may be reduced.

Lastly, it should be noted that the above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure. As long as the features between the embodiments do not violate the spirit of the disclosure or conflict with each other, they may be mixed and used arbitrarily.

What is claimed is:

1. A display device, comprising:
a display panel;
a substrate overlapped with the display panel; and
a plurality of vibrators overlapped with the display panel,
wherein at least a part of the plurality of vibrators are arranged along a part of an edge of the substrate,
wherein another part of the plurality of vibrators are arranged along a contour formed by the part of the plurality of vibrators,
wherein a closest distance from one of the part of the plurality of vibrators to the edge of the substrate is 0.5 to 1 times a closest distance from one of the another part of the plurality of vibrators to the edge of the substrate,
wherein the display device further comprises a circuit layer and a plurality of wires, the circuit layer comprises a plurality of electrodes, and one of the plurality of electrodes is electrically connected to at least two of the plurality of vibrators through at least two of the plurality of wires.

2. The display device of claim 1, wherein in a top view, there is a virtual straight line connecting centers of adjacent two of the plurality of vibrators, an extension line of the virtual straight line and an extension line of the part of the edge of the substrate form an included angle, and the included angle is in a range between 0 degree to 20 degrees.

3. The display device of claim 1, wherein the substrate is located between the display panel and the plurality of vibrators.

4. The display device of claim 1, wherein the plurality of vibrators is located between the display panel and the substrate.

5. The display device of claim 1, further comprising a flexible printed circuit board electrically connected to the circuit layer.

6. The display device of claim 1, further comprising a function layer, wherein the function layer is disposed on the plurality of vibrators.

7. The display device of claim 6, wherein the function layer is a discontinuous layer.

* * * * *